United States Patent
Sigl et al.

(10) Patent No.: US 10,889,492 B2
(45) Date of Patent: Jan. 12, 2021

(54) METHODS FOR PRODUCING THIN-FILM LAYERS AND MICROSYSTEMS HAVING THIN-FILM LAYERS

(71) Applicant: Infineon Technologies AG, Neubiberg (DE)

(72) Inventors: Alfred Sigl, Sinzing (DE); Wolfgang Friza, Villach (AT); Stefan Geissler, Regensburg (DE)

(73) Assignee: INFINEON TECHNOLOGIES AG, Neubiberg (DE)

(*) Notice: Subject to any disclaimer, the term of this patent is extended or adjusted under 35 U.S.C. 154(b) by 84 days.

(21) Appl. No.: 16/269,225

(22) Filed: Feb. 6, 2019

(65) Prior Publication Data
US 2019/0241431 A1    Aug. 8, 2019

(30) Foreign Application Priority Data

Feb. 7, 2018   (DE) .................. 10 2018 201 931
Aug. 20, 2018  (DE) .................. 10 2018 214 017

(51) Int. Cl.
| | | |
|---|---|---|
| B81C 1/00 | (2006.01) | |
| H04R 19/00 | (2006.01) | |
| H01L 21/311 | (2006.01) | |
| H01L 21/677 | (2006.01) | |
| H01L 23/00 | (2006.01) | |

(52) U.S. Cl.
CPC ...... B81C 1/00349 (2013.01); B81C 1/00182 (2013.01); B81C 1/00523 (2013.01); H01L 21/311 (2013.01); H01L 21/67763 (2013.01); H01L 24/94 (2013.01); H04R 19/005 (2013.01); B81B 2201/0257 (2013.01); B81C 2201/0194 (2013.01); H01L 2924/1461 (2013.01)

(58) Field of Classification Search
CPC ............ B81C 1/00349; B81C 1/00182; B81C 1/00373; B81C 2201/0194; B81C 1/00015; H04R 19/005; H01L 2924/1461; H01L 21/311; H01L 21/67763
See application file for complete search history.

(56) References Cited

U.S. PATENT DOCUMENTS

2010/0316849 A1*  12/2010  Millward ............... B82Y 40/00
                                                428/195.1
2014/0084240 A1    3/2014   Hu et al.

FOREIGN PATENT DOCUMENTS

| DE | 10162983 A1 | 7/2003 |
|---|---|---|
| DE | 10241450 A1 | 3/2004 |
| DE | 10246053 A1 | 4/2004 |

* cited by examiner

*Primary Examiner* — Marcos D. Pizarro
*Assistant Examiner* — Antonio B Crite
(74) *Attorney, Agent, or Firm* — Slater Matsil, LLP

(57) ABSTRACT

A method for producing a thin-film layer includes providing a layer stack on a carrier substrate, wherein the layer stack includes a carrier layer and a sacrificial layer, and wherein the sacrificial layer includes areas in which the carrier layer is exposed. The method includes providing the thin-film layer on the layer stack, such that the thin-film layer bears on the sacrificial layer and, in the areas of the sacrificial layer in which the carrier layer is exposed, against the carrier layer. The method includes at least partly removing the sacrificial layer from the thin-film layer in order to eliminate a contact between the thin-film layer and the sacrificial layer in some areas. The method also includes detaching the thin-film layer from the carrier layer.

17 Claims, 21 Drawing Sheets

Device Release (optional)

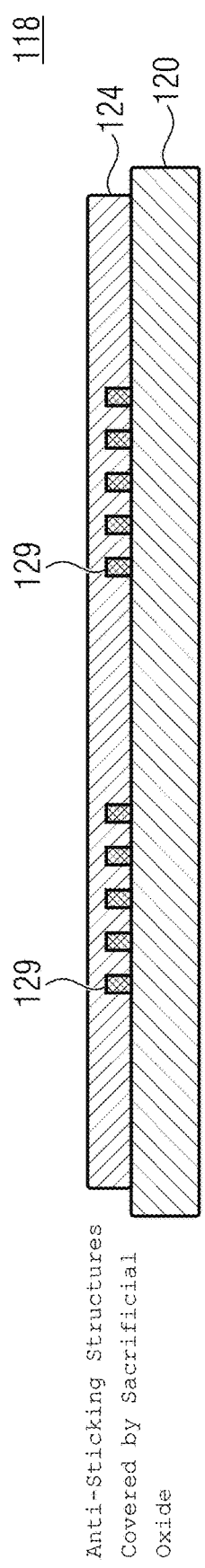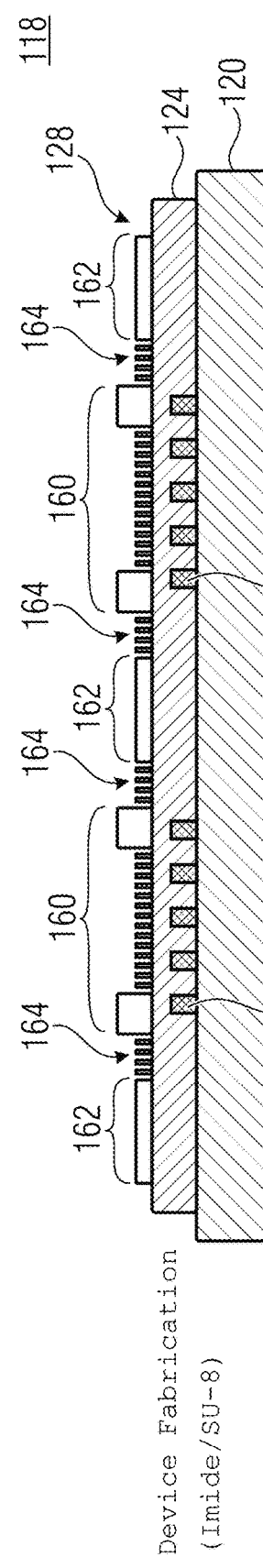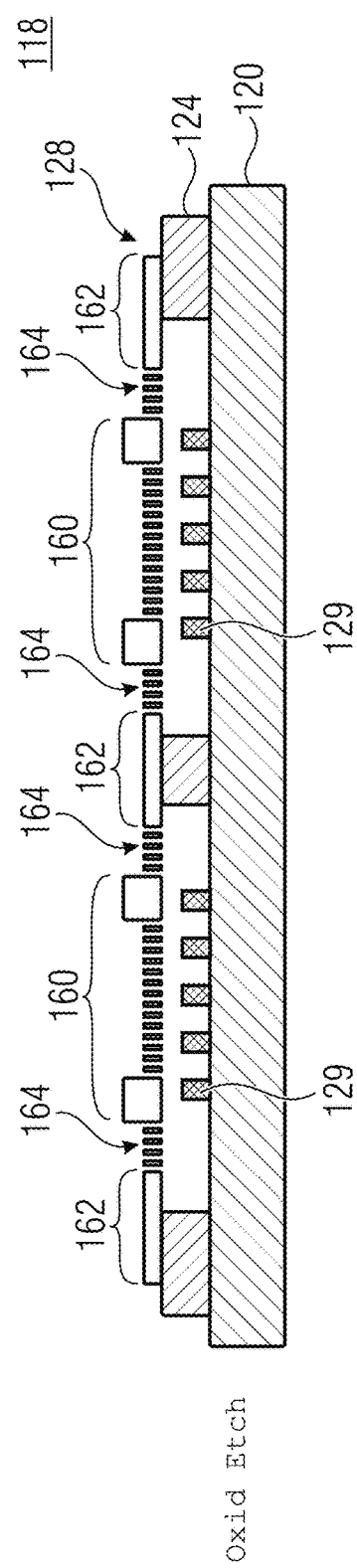

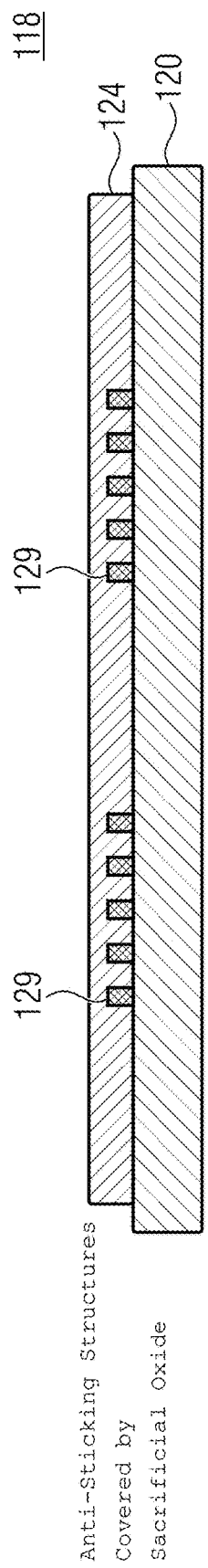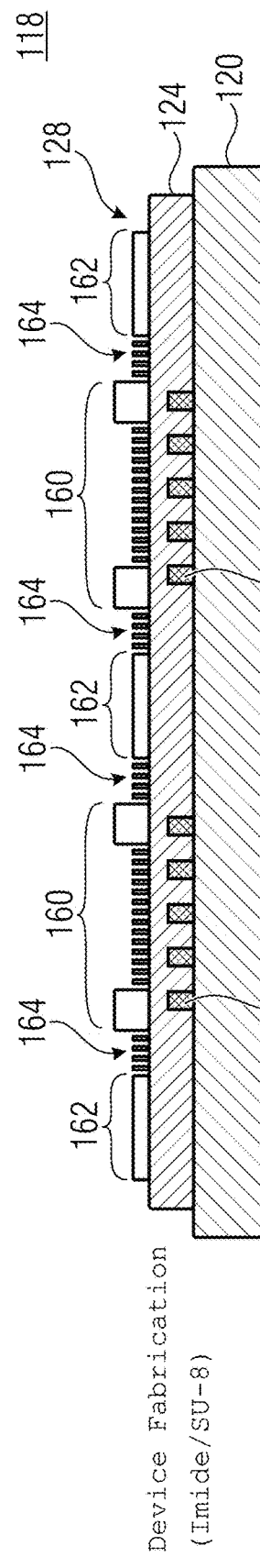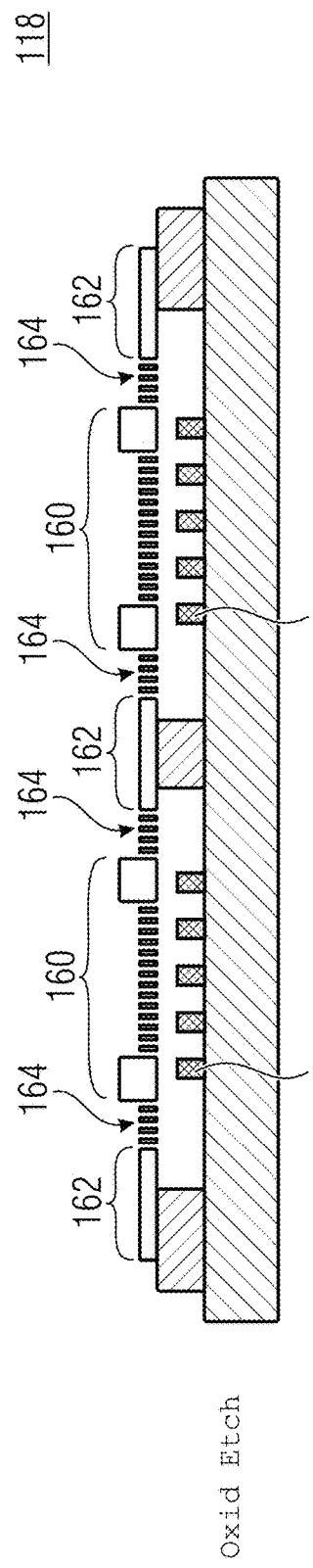

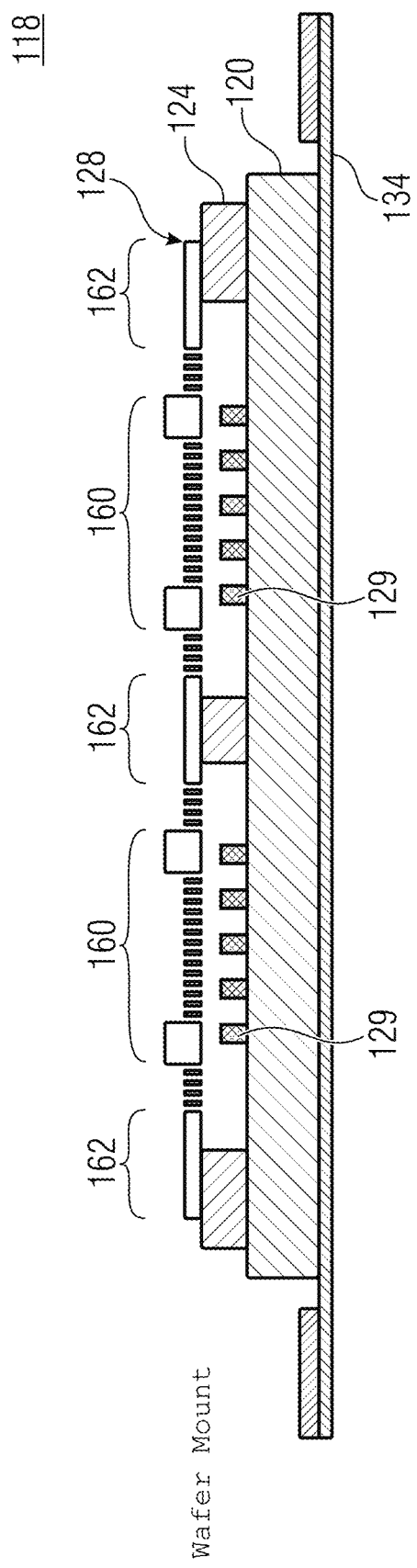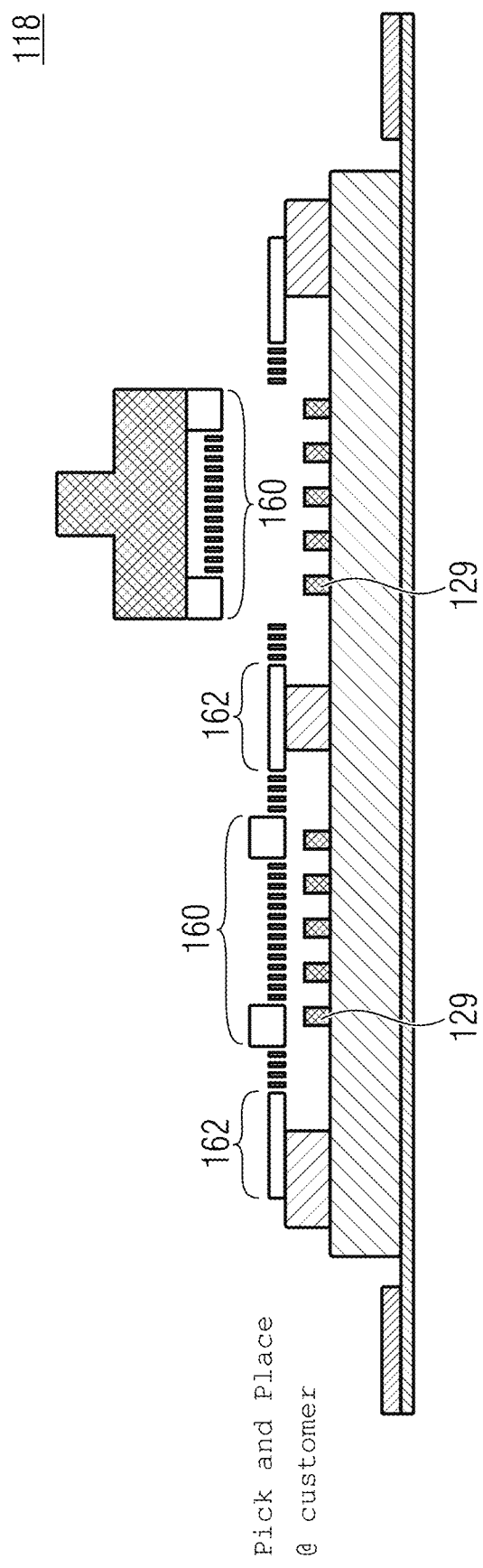

METHODS FOR PRODUCING THIN-FILM LAYERS AND MICROSYSTEMS HAVING THIN-FILM LAYERS

This application claims the benefit of German Application Nos. 102018201931.2, filed on Feb. 7, 2018 and 102018214017.0, filed Aug. 20, 2018, which applications are hereby incorporated herein by reference.

TECHNICAL FIELD

Exemplary embodiments relate to a method for producing a thin-film layer. Further exemplary embodiments relate to a method for producing a microsystem having a thin-film layer. Some exemplary embodiments relate to a method for zero force debonding of a thin device by means of high/low force areas.

BACKGROUND

Wafers having a thickness of less than 100 µm cannot be handled using standard tools. Therefore, these wafers are mounted onto a carrier wafer. An entire process chain for handling thin wafers has been developed by industry. However, very thin and fragile structures can be damaged by the standard thin-wafer processing steps.

SUMMARY

Exemplary embodiments provide a method for producing a thin-film layer (or a microsystem having a thin-film layer). The method comprises a step of providing a carrier substrate. Furthermore, the method comprises a step of providing a layer stack on the carrier substrate, wherein the layer stack comprises a carrier layer and a sacrificial layer, wherein the sacrificial layer comprises areas in which the carrier layer is exposed. Furthermore, the method comprises a step of providing the thin-film layer on the layer stack, such that the thin-film layer bears on the sacrificial layer and, in the areas of the sacrificial layer in which the carrier layer is exposed, against the carrier layer. Furthermore, the method comprises a step of at least partly removing the sacrificial layer proceeding from the thin-film layer in order to eliminate a contact between the thin-film layer and the sacrificial layer at least in areas. Furthermore, the method comprises a step of detaching the thin-film layer from the carrier layer.

In exemplary embodiments, the thin-film layer can have a thickness of less than 100 µm (or 70 µm, or 50 µm, or 30 µm, or 20 µm, or 10 µm, or 5 µm).

In exemplary embodiments, the thin-film layer can be a membrane or a filter, for example of a microsystem (MEMS=microelectromechanical system).

In exemplary embodiments, the thin-film layer can be a polyimide layer or a combination of polyimide layer and SU-8 layer.

In exemplary embodiments, an exposed surface area of the carrier layer (=surface area of the carrier layer which is exposed in the areas of the sacrificial layer, or surface area of the carrier layer that is not covered by the sacrificial layer) can occupy for example less than 40% (or 30%, or 20%, or 15%, or 10%, or 5%) of a total surface area of the carrier layer.

In exemplary embodiments, detaching the thin-film layer can comprise the following steps: (1) providing an at least single-sided-adhesive transfer carrier layer on the thin-film layer such that the thin-film layer adheres to the adhesion layer, and (2) detaching the transfer carrier layer in order to detach the thin-film layer adhering to the transfer carrier layer from the carrier layer.

In exemplary embodiments, the transfer carrier layer can comprise an adhesive layer on a side facing the thin-film layer.

In exemplary embodiments, the method can furthermore comprise a step of structuring the thin-film layer before detaching the thin-film layer.

In exemplary embodiments, the method can furthermore comprise a step of producing at least one microsystem on the thin-film layer, wherein during the process of detaching the thin-film layer, the at least one microsystem is detached together with the thin-film layer.

In exemplary embodiments, the thin-film layer can be part of the at least one microsystem.

In exemplary embodiments, providing the layer stack can comprise the following steps: (1) providing the carrier layer on the carrier substrate, (2) providing the sacrificial layer on the carrier layer, and (3) opening the sacrificial layer in areas as far as the carrier layer in order to obtain the areas in which the carrier layer is exposed.

In exemplary embodiments, the areas in which the carrier layer is exposed can be holes.

In exemplary embodiments, the holes can have a diameter of 7 µm.

In exemplary embodiments, the sacrificial layer can be a second sacrificial layer, wherein providing the layer stack can comprise the following steps: (1) providing a first sacrificial layer on the carrier substrate, wherein the first sacrificial layer comprises elevations, (2) providing the carrier layer on the first sacrificial layer, (3) providing the second sacrificial layer on the carrier layer, and (4) at least partly removing the second sacrificial layer as far as the carrier layer on the elevations of the first sacrificial layer in order to obtain the areas in which the carrier layer is exposed.

In exemplary embodiments, the elevations can have a diameter of 20 µm or less.

In exemplary embodiments, the sacrificial layer can comprise silicon oxide, aluminum, titanium or copper.

In exemplary embodiments, the carrier layer can comprise nitride or silicon nitride.

Further exemplary embodiments provide a method for producing a thin-film layer. The method comprises a step of providing a carrier substrate. Furthermore, the method comprises a step of providing a sacrificial layer on the carrier substrate. Furthermore, the method comprises a step of providing the thin-film layer on the sacrificial layer. Furthermore, the method comprises a step of structuring the thin-film layer in order to obtain in a lateral plane of the thin-film layer an inner area of the thin-film layer which is at least partly surrounded by an outer area of the thin-film layer, wherein during the process of structuring the thin-film layer, at least one opening arises in the thin-film layer which at least partially frees the inner area of the thin-film layer in the lateral plane, wherein during the process of structuring the thin-film layer, at least two webs remain which extend in a lateral plane of the thin-film layer from the outer area of the thin-film layer into the opening in the direction of the inner area of the thin-film layer. Furthermore, the method comprises a step of at least partly removing the sacrificial layer proceeding from the thin-film layer in order to eliminate a contact between the inner area of the thin-film layer and the sacrificial layer. Furthermore, the method comprises a step of detaching the inner area of the thin-film layer from the outer area of the thin-film layer.

In exemplary embodiments, the thin-film layer can have a thickness of less than 100 µm (or 70 µm, or 50 µm, or 30 µm, or 20 µm, or 10 µm, or 5 µm).

In exemplary embodiments, the thin-film layer or the inner area of the thin-film layer can be a membrane or a filter, for example a microsystem (MEMS=microelectromechanical system).

In exemplary embodiments, the thin-film layer can be a polyimide layer or a combination of polyimide layer and SU-8 layer.

In exemplary embodiments, the outer area of the thin-film layer which at least partly surrounds the inner area of the thin-film layer can form a frame structure. By way of example, the frame structure can completely surround the inner area of the thin-film layer. Of course, the frame structure can also only partly surround the inner area of the thin-film layer, for example at opposite sides of the inner area of the thin-film layer.

In exemplary embodiments, during the process of structuring the thin-film layer, the inner area of the thin-film layer can be freed in the lateral plane of the thin-film layer, wherein after structuring the thin-film layer, a carrier layer can be provided (e.g. deposited) on the thin-film layer and structured in order to obtain a carrier structure extending over the inner area of the thin-film layer and at least partly over the webs, such that the carrier structure connects the inner area of the thin-film layer to the webs.

By way of example, the inner area of the thin-film layer can be completely separated from the outer area of the thin-film layer in a lateral plane of the thin-film layer. During the process of structuring the thin-film layer, an opening can thus form in the thin-film layer between the inner area of the thin-film layer and the outer area of the thin-film layer, wherein the opening completely surrounds the inner area of the thin-film layer. Since the at least two webs proceeding from the outer area of the thin-film layer project into the opening in the direction of the thin-film layer but do not reach the inner area of the thin-film layer (i.e. are not connected to the inner area of the thin-film layer), it is possible to provide on the inner area of the thin-film layer a carrier structure extending as far as the at least two webs, such that the inner area of the thin-film layer is connected to the at least two webs by way of the carrier structure, such that after removing the sacrificial layer below the inner area of the thin-film layer, e.g. by undercutting, the inner area of the thin-film layer is carried by the at least two webs of the outer area of the thin-film layer by way of the carrier structure.

In exemplary embodiments, after at least partly removing the sacrificial layer, the inner area of the thin-film layer can be carried by the at least two webs of the outer area of the thin-film layer by way of the carrier structure.

By way of example, the carrier structure can extend at least partly over the at least two webs, such that the carrier structure bears on the at least two webs of the outer area of the thin-film layer.

In exemplary embodiments, the carrier layer, after the process of structuring the thin-film layer, can be provided on the thin-film layer and on the sacrificial layer in the region of the opening of the thin-film layer.

By way of example, the carrier structure can thus extend at least partly over the opening between the inner area of the thin-film layer and the outer area of the thin-film layer, e.g. between the areas of the webs on which the carrier layer bears.

In exemplary embodiments, the sacrificial layer proceeding from the thin-film layer can be at least partly removed by etching in order to eliminate the contact between the inner area of the thin-film layer and the sacrificial layer.

By way of example, the sacrificial layer can be undercut in the area below the inner area of the thin-film layer. During the etching process, a top side of the inner area of the thin-film layer can be protected by the carrier structure, such that the inner area of the thin-film layer is undercut proceeding from the opening between the inner area of the thin-film layer and the outer area of the thin-film layer.

In exemplary embodiments, the carrier layer (or carrier structure) and/or the sacrificial layer can have in each case a higher etching rate than the thin-film layer.

In exemplary embodiments, during the process of detaching the inner area of the thin-film layer, the carrier structure can be detached together with the inner area of the thin-film layer.

In exemplary embodiments, the carrier layer can have a thickness of more than 30 µm (or 40 µm, or 50 µm, or 60 µm). By way of example, the thickness of the carrier layer can be in the range of 40 µm to 100 µm.

In exemplary embodiments, the carrier layer can be a polymer layer, such as e.g. an SU-8 layer.

In exemplary embodiments, during the process of structuring the thin-film layer, at least two openings can arise in the thin-film layer which partially (i.e. not completely) free the inner area of the thin-film layer in the lateral plane, wherein the at least two webs remain between the openings and connect the inner area of the thin-film layer to the outer area of the thin-film layer.

By way of example, during the process of structuring the thin-film layer, the inner area of the thin-film layer can be only partly separated from the outer area of the thin-film layer, that is to say that although openings arise between the inner area of the thin-film layer and the outer area of the thin-film layer, these are still connected by thin webs, such that after removing the sacrificial layer below the inner area of the thin-film layer, e.g. by undercutting, the inner area of the thin-film layer is carried by the at least two webs of the outer area of the thin-film layer.

In exemplary embodiments, after at least partly removing the sacrificial layer, the inner area of the thin-film layer can be carried by the at least two webs.

In exemplary embodiments, during the process of detaching the inner area of the thin-film layer from the outer area of the thin-film layer, the at least two webs can break.

In exemplary embodiments, the at least two webs can in each case comprise a tapering area. The tapering areas of the at least two webs can be predetermined breaking locations, for example, which define the locations at which the at least two webs break during the process of detaching the inner area of the thin-film layer.

In exemplary embodiments, detaching the thin-film layer can comprise the following steps: (1) providing an at least single-sided-adhesive transfer carrier layer on the inner area of the thin-film layer (or on the carrier structure on the inner area of the thin-film layer); and (2) detaching the transfer carrier layer in order to detach the inner area of the thin-film layer adhering to the transfer carrier layer (or the carrier structure, and thus also the inner area of the thin-film layer, adhering to the transfer carrier layer) from the outer area of the thin-film layer.

In exemplary embodiments, the transfer carrier layer can comprise an adhesive layer on a side facing the thin-film layer.

In exemplary embodiments, the method can comprise a step of producing at least one microsystem on the inner area of the thin-film layer, wherein during the process of detaching the inner area of the thin-film layer, the at least one microsystem is detached together with the inner area of the thin-film layer.

By way of example, the microsystem can be produced before providing the carrier layer, wherein after the at least one microsystem has been produced, the carrier layer is provided on the at least one microsystem, such that the microsystem is protected by the carrier layer.

In exemplary embodiments, the inner area of the thin-film layer can be part of the at least one microsystem.

In exemplary embodiments, the sacrificial layer can comprise silicon oxide.

In exemplary embodiments, the method can furthermore comprise a step of providing an anti-sticking structure on the carrier substrate, wherein the sacrificial layer is provided on the carrier substrate and the anti-sticking structure, wherein the inner area of the thin-film layer that results during the process of structuring the thin-film layer is arranged adjacent to the anti-sticking structure, wherein during the process of at least partly removing the sacrificial layer, the anti-sticking structure is at least partly exposed, wherein during the process of detaching the inner area of the thin-film layer, the inner area of the thin-film layer is lifted off from the anti-sticking structure.

In exemplary embodiments, the anti-sticking structure can comprise elevations extending in at least one lateral dimension along a surface of the carrier substrate.

In exemplary embodiments, the elevations can have a width of less than 2 µm.

In exemplary embodiments, the elevations can extend in one lateral dimension, wherein the elevations, in a lateral plane of same, form lines.

In exemplary embodiments, the elevations can extend in two lateral dimensions, wherein the elevations, in a lateral plane of same, form circles.

In exemplary embodiments, the inner area of the thin-film layer can comprise a lattice structure having hexagonal openings, wherein the lattice structure forms a particle barrier, a filter or a membrane.

In exemplary embodiments, the method can furthermore comprise a step of providing a further anti-sticking structure on an outer area of the thin-film layer or on a layer arranged thereon, wherein detaching the thin-film layer can comprise the following steps: providing an at least single-sided-adhesive transfer carrier layer on the inner area of the thin-film layer and the further anti-sticking structure; detaching the transfer carrier layer in order to detach the inner area of the thin-film layer adhering to the transfer carrier layer from the outer area of the thin-film layer.

In exemplary embodiments, the method can furthermore comprise a step of providing a wafer and a step of mounting the carrier substrate on the wafer before detaching the inner area of the thin-film layer from the outer area of the thin-film layer.

In exemplary embodiments, the inner area of the thin-film layer can be detached from the outer area of the thin-film layer by means of a pick-and-place method.

By way of example, the anti-sticking structure can be embedded in oxide before the etching-free process. During the oxide etch, the thin-film layer (e.g. filter structure) can come into contact with the anti-sticking structure.

By way of example, the anti-sticking structure can be constructed as a line in order that the thin-film layer (e.g. filter structure) cannot fall down.

By way of example, the thin-film layer (e.g. filter structure) can have only slight contact with the anti-sticking structure, such that during the process of detaching the inner area of the thin-film layer, the inner area of the thin-film layer is lifted off from the anti-sticking structure.

Further exemplary embodiments provide a method for producing a thin-film layer. The method comprises a step of providing a carrier substrate. Furthermore, the method comprises a step of providing an anti-sticking structure on the carrier substrate. Furthermore, the method comprises a step of providing a sacrificial layer on the anti-sticking structure and the carrier substrate. Furthermore, the method comprises a step of providing the thin-film layer on the sacrificial layer. Furthermore, the method comprises a step of structuring the thin-film layer in order to obtain in a lateral plane of the thin-film layer an inner area of the thin-film layer which is at least partly surrounded by an outer area of the thin-film layer and is arranged in a vertical direction above the anti-sticking structure, wherein during the process of structuring the thin-film layer, at least one opening arises in the thin-film layer which at least partially frees the inner area of the thin-film layer in the lateral plane, wherein during the process of structuring the thin-film layer, at least two webs remain which extend in a lateral plane of the thin-film layer from the outer area of the thin-film layer into the opening in the direction of the inner area of the thin-film layer. Furthermore, the method comprises a step of at least partly removing the sacrificial layer proceeding from the thin-film layer in order to eliminate a contact between the inner area of the thin-film layer and the sacrificial layer, wherein during the process of at least partly removing the sacrificial layer, the anti-sticking structure is at least partly exposed.

In exemplary embodiments, the anti-sticking structure serves to ensure that the thin-film layer (e.g. filter) does not stick to the support, while the webs hold the thin-film layer (e.g. filter) in position until the latter is lifted off e.g. with a tape.

In exemplary embodiments, the anti-sticking structure can comprise elevations extending in at least one lateral dimension along a surface of the carrier substrate.

In exemplary embodiments, the elevations can have a width of less than 2 µm.

In exemplary embodiments, the elevations can extend in one lateral dimension, wherein the elevations, in a lateral plane of same, form lines.

In exemplary embodiments, the elevations can extend in two lateral dimensions, wherein the elevations, in a lateral plane of same, form circles.

In exemplary embodiments, the inner area of the thin-film layer can comprise a lattice structure having hexagonal openings, wherein the lattice structure forms a particle barrier, a filter or a membrane.

In exemplary embodiments, the method can furthermore comprise a step of providing a further anti-sticking structure on an outer area of the thin-film layer or on a layer arranged thereon, a step of providing an at least single-sided-adhesive transfer carrier layer on the inner area of the thin-film layer and the further anti-sticking structure, and a step of detaching the transfer carrier layer in order to detach the inner area of the thin-film layer adhering to the transfer carrier layer from the outer area of the thin-film layer.

In exemplary embodiments, the method can furthermore comprise a step of providing a wafer and mounting the carrier substrate on the wafer.

In exemplary embodiments, the method can furthermore comprise a step of lifting off (or detaching) the inner area of the thin-film layer from the outer area of the thin-film layer e.g. by means of a pick-and-place method.

BRIEF DESCRIPTION OF THE DRAWINGS

Exemplary embodiments of the present invention are described in greater detail with reference to the accompanying figures, in which:

FIG. 36 shows a schematic sectional view of an intermediate product of the method for producing a thin-film layer after the steps of providing the carrier substrate, providing the anti-sticking structure on the carrier substrate and providing the sacrificial layer on the anti-sticking structure and the carrier substrate;

FIG. 37 shows a schematic sectional view of an intermediate product of the method for producing a thin-film layer after the step of providing the thin-film layer on the sacrificial layer and after the step of structuring the thin-film layer;

FIG. 38 shows a schematic sectional view of an intermediate product of the method for producing a thin-film layer after the step of at least partly removing the sacrificial layer proceeding from the thin-film layer in order to eliminate a contact between the inner area of the thin-film layer and the sacrificial layer;

FIG. 41 shows a schematic sectional view of an intermediate product of the method for producing a thin-film layer after the steps of providing the carrier substrate, providing the anti-sticking structure on the carrier substrate and providing the sacrificial layer on the anti-sticking structure and the carrier substrate;

FIG. 42 shows a schematic sectional view of an intermediate product of the method for producing a thin-film layer after the step of providing the thin-film layer on the sacrificial layer and after the step of structuring the thin-film layer;

FIG. 43 shows a schematic sectional view of an intermediate product of the method for producing a thin-film layer after the step of at least partly removing the sacrificial layer proceeding from the thin-film layer in order to eliminate a contact between the inner area of the thin-film layer and the sacrificial layer;

FIG. 44 shows a schematic sectional view of an intermediate product of the method for producing a thin-film layer after a step of providing a wafer and mounting the carrier substrate on the wafer before detaching the inner area of the thin-film layer from the outer area of the thin-film layer;

FIG. 45 shows a schematic sectional view of an intermediate product of the method for producing a thin-film layer after a step of detaching the inner area of the thin-film layer from the outer area of the thin-film layer by means of a pick-and-place method.

DETAILED DESCRIPTION OF ILLUSTRATIVE EMBODIMENTS

In the following description of the exemplary embodiments of the present invention, in the figures identical or identically acting elements are provided with the same reference sign, and so the description thereof is mutually interchangeable.

Figure 1:
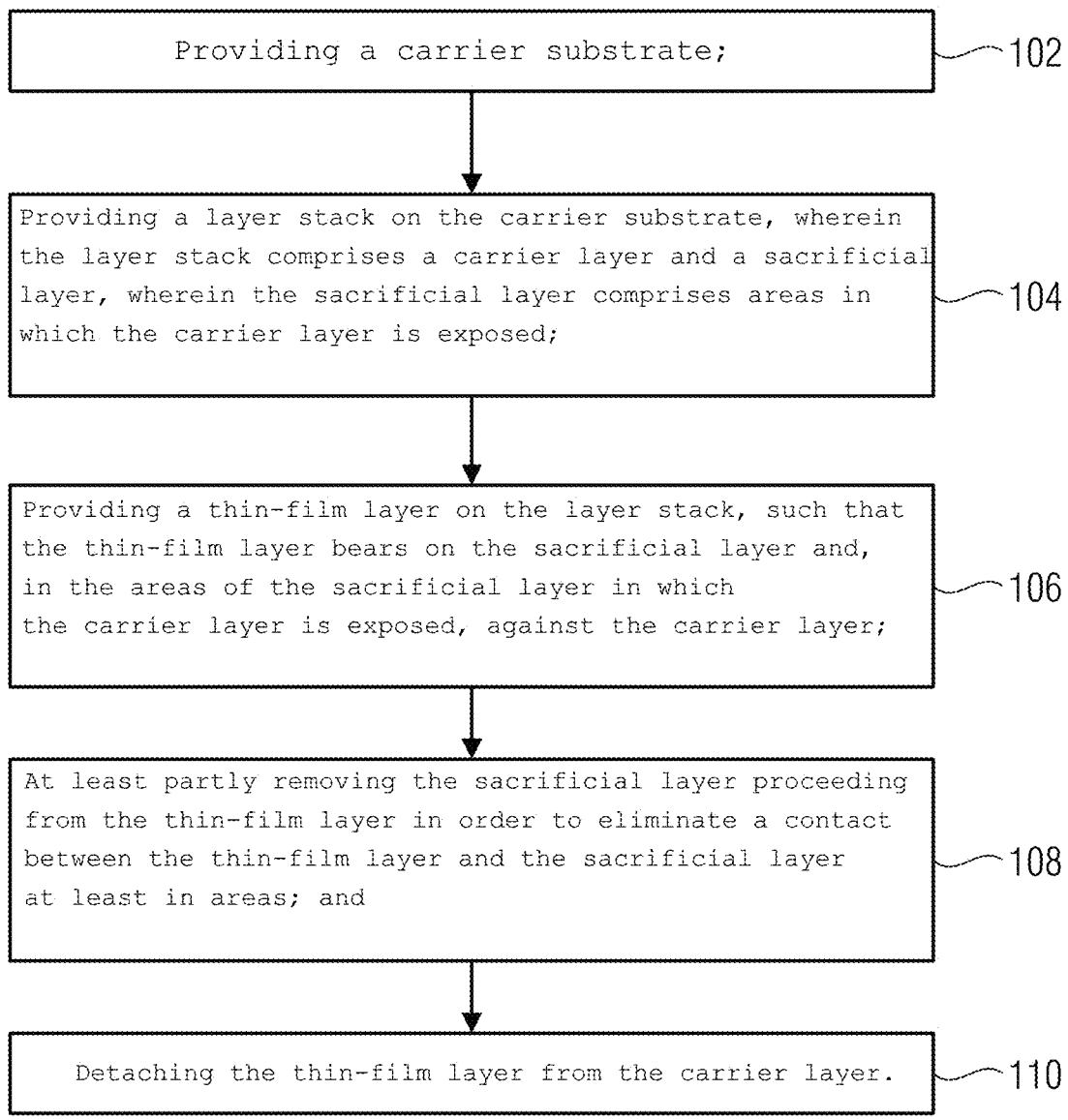
FIG. 1 shows a flow diagram of a method for producing a thin-film layer.

FIG. 1 shows a flow diagram of a method 100 for producing a thin-film layer. The method 100 comprises a step 102 of providing a carrier substrate. Furthermore, the method 100 comprises a step 104 of providing a layer stack on the carrier substrate, wherein the layer stack comprises a carrier layer and a sacrificial layer, wherein the sacrificial layer comprises areas in which the carrier layer is exposed. Furthermore, the method 100 comprises a step 106 of providing the thin-film layer on the layer stack, such that the thin-film layer bears on the sacrificial layer and, in the areas of the sacrificial layer in which the carrier layer is exposed, against the carrier layer. Furthermore, the method 100 comprises a step 108 of at least partly removing the sacrificial layer proceeding from the thin-film layer in order to eliminate a contact between the thin-film layer and the sacrificial layer at least in areas. Furthermore, the method 100 comprises a step no of detaching the thin-film layer from the carrier layer.

Exemplary embodiments of the method 100 are described in detail below with reference to FIGS. 2 to 19, which show schematic sectional views of intermediate products of the production of a thin-film layer after the various method steps. In detail, a first exemplary embodiment is described with reference to FIGS. 2 to 8, and a second exemplary embodiment with reference to FIGS. 9 to 19, wherein the two exemplary embodiments differ in particular in the production of the layer stack comprising the carrier layer and the sacrificial layer.

Figure 2:
FIG. 2 shows a schematic sectional view of an intermediate product of the method for producing a thin-film layer after the step of providing the carrier substrate.

FIG. 2 shows a schematic sectional view of an intermediate product 118 of the method for producing a thin-film layer after step 102 of providing the carrier substrate 120. The carrier substrate 120 can be for example a semiconductor substrate or semiconductor wafer, such as e.g. a silicon substrate or silicon wafer.

Figure 3:
FIG. 3 shows a schematic sectional view of an intermediate product of the method for producing a thin-film layer after a step of providing the carrier layer on the carrier substrate.

With reference to FIGS. 2 and 3, a more detailed description is given below of providing 104 the layer stack comprising the carrier layer and the sacrificial layer.

FIG. 3 shows a schematic sectional view of an intermediate product 118 of the method for producing a thin-film layer after a step of providing the carrier layer 122 on the carrier substrate 120. The carrier layer 122 can be deposited onto the carrier substrate, for example. The carrier layer 122 can comprise silicon nitride, for example.

Figure 4:
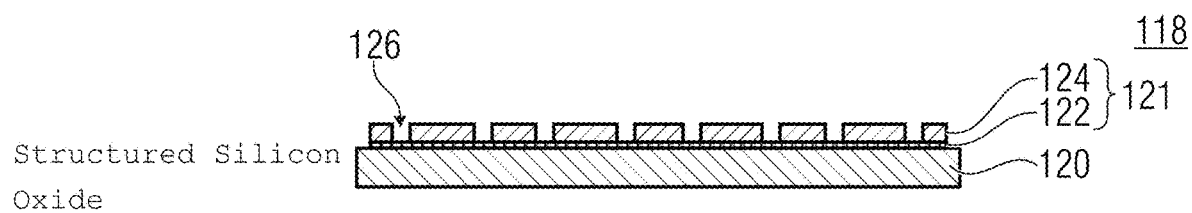
FIG. 4 shows a schematic sectional view of an intermediate product of the method for producing a thin-film layer after a step of providing a structured sacrificial layer on the carrier layer.

FIG. 4 shows a schematic sectional view of an intermediate product 118 of the method for producing a thin-film layer after a step of providing a structured sacrificial layer 124 on the carrier layer 122. The sacrificial layer 124 can for example be deposited onto the carrier layer 122 and subsequently be structured, e.g. by means of a photolithographic method and subsequent etching, in order to obtain the areas 126 of the sacrificial layer 124 in which the carrier layer 122 is exposed. By virtue of the fact that the carrier layer 122 is exposed only in the areas 126, for example less than 40% (or 30%, or 20%, or 15%, or 10%, or 5%) of the carrier layer 122 can be exposed, i.e. not be covered by the sacrificial layer 124.

As can be discerned by way of example in FIG. 4, the areas 126 of the sacrificial layer 124 in which the carrier layer 122 is exposed can be holes or trenches, for example.

By way of example, the sacrificial layer 124 can be a silicon oxide layer, an aluminum layer, a titanium layer, or a copper layer.

Figure 5:
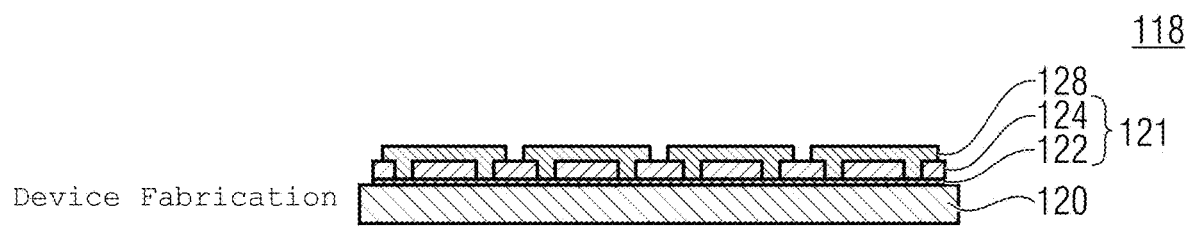
FIG. 5 shows a schematic sectional view of an intermediate product of the method for producing a thin-film layer after the step of providing a thin-film layer on the structured sacrificial layer and, in the areas of the sacrificial layer in which the carrier layer is exposed, on the carrier layer.

FIG. 5 shows a schematic sectional view of an intermediate product 118 of the method for producing a thin-film layer after step 106 of providing a thin-film layer 128 on the structured sacrificial layer 124 and, in the areas 126 of the sacrificial layer 124 in which the carrier layer 122 is exposed, on the carrier layer 122. The thin-film layer 128 can be deposited for example onto the structured sacrificial layer 124 and the exposed areas of the carrier layer 122. The thin-film layer 128 can have a thickness of less than 100 µm or 70 µm, or 50 µm, or 30 µm, or 20 µm, or 10 µm.

As can be discerned in FIG. 5, the thin-film layer 128 can optionally be structured in order to obtain a structured thin-film layer 128. The thin-film layer 128 can be structured for example by means of a photolithographic method and subsequent etching.

By way of example, the thin-film layer 128 can be a membrane or a filter, for example of a microsystem (MEMS=microelectromechanical system). The microsystem can be produced for example on the thin-film layer 128 (see FIG. 16), such that the thin-film layer 128 is part of the microsystem.

By way of example, the thin-film layer can be a polyimide layer or a combination of polyimide layer and SU-8 layer.

Figure 6:
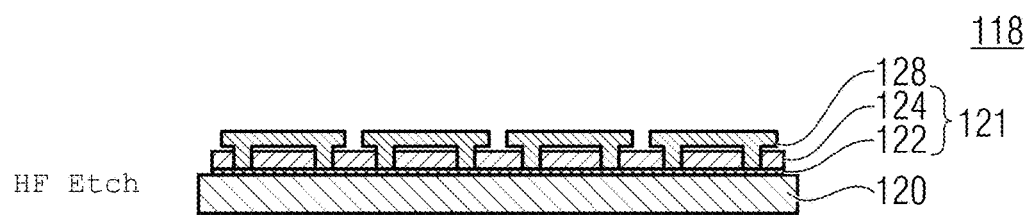
FIG. 6 shows a schematic sectional view of an intermediate product of the method for producing a thin-film layer after the step of at least partly removing the sacrificial layer proceeding from the thin-film layer in order to eliminate a contact between the thin-film layer and the sacrificial layer at least in areas, such that the thin-film layer is carried principally only by the carrier layer.

FIG. 6 shows a schematic sectional view of an intermediate product 118 of the method for producing a thin-film layer after step 108 of at least partly removing the sacrificial layer 124 proceeding from the thin-film layer 128 (=in the substrate depth direction) in order to eliminate a contact between the thin-film layer 128 and the sacrificial layer 124 at least in areas, such that the thin-film layer 128 is carried principally only by the carrier layer 122. While the thin-film layer is still in contact with the carrier layer 122, the contact between the thin-film layer 128 and the sacrificial layer 124 has thus been eliminated for the most part by partly removing the sacrificial layer 124 proceeding from the thin-film layer 128.

As can be discerned in FIG. 6, the thin-film layer 128 is thus carried only (i.e. primarily or principally) by the carrier layer 122.

By way of example, the sacrificial layer 124 can be eliminated at least in areas by means of an HF etch (HF=hydrofluoric acid) proceeding from the thin-film layer 128.

Figure 7:
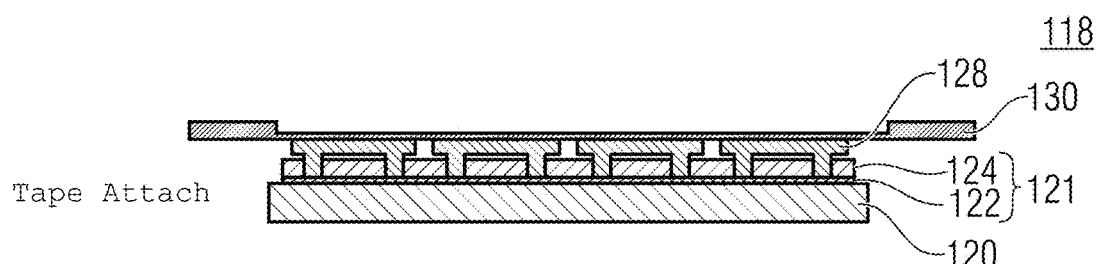
FIG. 7 shows a schematic sectional view of an intermediate product of the method for producing a thin-film layer after the step of providing an at least single-sided-adhesive transfer carrier layer on the thin-film layer, such that the thin-film layer adheres to the transfer carrier layer.

FIG. 7 shows a schematic sectional view of an intermediate product 118 of the method for producing a thin-film layer after the step of providing an at least single-sided-adhesive transfer carrier layer 130 on the thin-film layer 128, such that the thin-film layer 128 adheres to the transfer carrier layer 130. By way of example, the transfer carrier layer 130 can comprise adhesive or an adhesive layer at a side facing the thin-film layer 128. By way of example, the transfer carrier layer 130 can be an adhesive tape.

Figure 8:
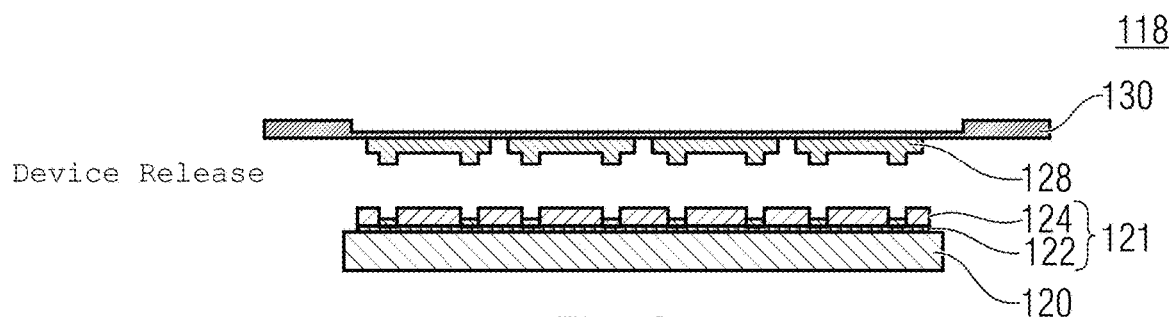
FIG. 8 shows a schematic sectional view of an intermediate product of the method for producing a thin-film layer after the step of detaching the thin-film layer from the carrier layer.

FIG. 8 shows a schematic sectional view of an intermediate product 118 of the method for producing a thin-film layer after step 110 of detaching the thin-film layer 128 from the carrier layer 122. As can be discerned in FIG. 8, the transfer carrier layer 130 can be detached in order to detach the thin-film layer 128 adhering to the transfer carrier layer 130 from the carrier layer 122.

FIGS. 2 to 8 show a first exemplary embodiment of a method for producing a polyimide device membrane on a carrier wafer with zero force release of the membrane from the carrier wafer. In this case, the polyimide device is processed on a silicon wafer with an oxide layer. Holes are processed into the oxide layer. The polyimide that flows into the holes serves as a holding area after the release process. The bottom of said holes is covered with silicon nitride. In order to release the very fragile device, it is possible to etch the oxide in HF. Owing to the stress/tension in the polyimide material, the HF etches very rapidly along the polyimide-silicon oxide surface and releases the device from the carrier alongside the holding pins situated on the silicon nitride surface. After this process, the devices are fixed to the carrier wafer only by way of the holding surfaces. A frame with an adhesive tape can then be attached to the wafer in such a way that the devices adhere to the adhesive tape. By lifting the frame, the holding surfaces are torn away and all the devices are released from the wafer.

In the first exemplary embodiment, it is possible to provide the extensions or holding structures at the components in the edge region thereof, i.e. outside the sensitive structures of the component.

In the first exemplary embodiment, an etch can be carried out along the interface between component and sacrificial material; the sacrificial material is for example only partly removed (partial etching away) in order to release the interface between component and sacrificial material, such that the component can then be removed from the carrier wafer. In this case, it is possible to achieve targeted "breaking" of the extensions at a substantially predetermined position.

With reference to FIGS. 9 to 19, a description is given below of a second exemplary embodiment of the method, which differs from the first exemplary embodiment in particular in the production of the layer stack comprising the carrier layer and the sacrificial layer.

Figure 9:
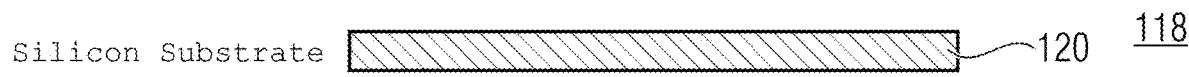
FIG. 9 shows a schematic sectional view of an intermediate product of the method for producing a thin-film layer after the step of providing the carrier substrate.

FIG. 9 shows a schematic sectional view of an intermediate product 118 of the method for producing a thin-film layer after step 102 of providing the carrier substrate 120. The carrier substrate 120 can be for example a semiconductor substrate or semiconductor wafer, such as e.g. a silicon substrate or silicon wafer.

With reference to FIGS. 10 to 14, a more detailed description is given below of providing 104 the layer stack comprising the carrier layer, a first sacrificial layer and a second sacrificial layer.

Figure 10:
FIG. 10 shows a schematic sectional view of an intermediate product of the method for producing a thin-film layer after a step of providing a first sacrificial layer on the carrier substrate.

FIG. 10 shows a schematic sectional view of an intermediate product 118 of the method for producing a thin-film layer after a step of providing a first sacrificial layer 123 on the carrier substrate 120. The first sacrificial layer 123 can be deposited onto the carrier substrate, for example. The first sacrificial layer 123 can be for example a silicon oxide layer, an aluminum layer, a titanium layer or a copper layer.

Figure 11:
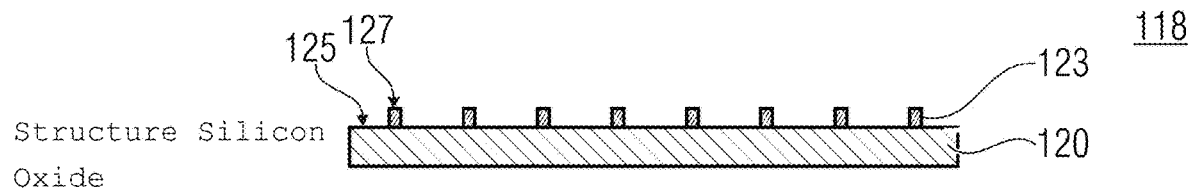
FIG. 11 shows a schematic sectional view of an intermediate product of the method for producing a thin-film layer after a step of structuring the first sacrificial layer.

FIG. 11 shows a schematic sectional view of an intermediate product 118 of the method for producing a thin-film layer after a step of structuring the first sacrificial layer 123. The first sacrificial layer 123 can be structured for example by means of a photolithographic method and subsequent etching.

As can be discerned in FIG. 11, the first sacrificial layer 123 can comprise elevations 127. By way of example, the elevations 127 can have a surface area (parallel to a surface 125 of the carrier substrate 120) of less than 40% (or 30%, or 20%, or 15%, or 10%, or 5%) of a total surface area of the (previously) deposited first sacrificial layer 123.

Figure 12:
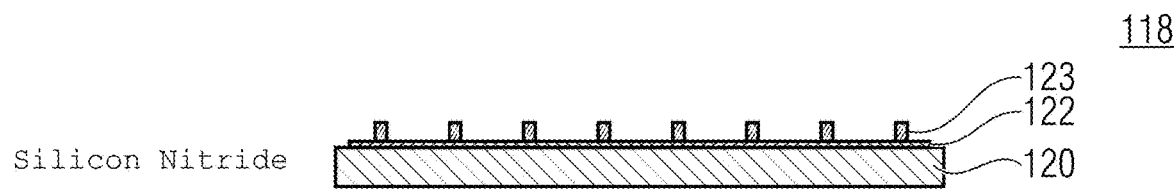
FIG. 12 shows a schematic sectional view of an intermediate product of the method for producing a thin-film layer after a step of providing the carrier layer on the first sacrificial layer.

FIG. 12 shows a schematic sectional view of an intermediate product 118 of the method for producing a thin-film layer after a step of providing the carrier layer 122 on the first sacrificial layer 123. The carrier layer 122 can be deposited for example onto the first sacrificial layer (and onto the carrier substrate 120). The carrier layer 122 can comprise nitride or silicon nitride, for example.

As can be discerned in FIG. 12, the carrier layer 122 can be applied on the elevations 127 of the first sacrificial layer 123 and on the carrier substrate 120.

Figure 13:
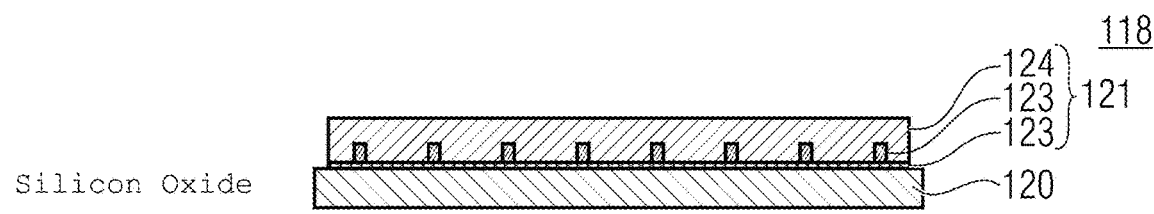
FIG. 13 shows a schematic sectional view of an intermediate product of the method for producing a thin-film layer after a step of providing the second sacrificial layer on the carrier layer.

FIG. 13 shows a schematic sectional view of an intermediate product 118 of the method for producing a thin-film layer after a step of providing the second sacrificial layer 124 on the carrier layer 122. The second sacrificial layer 124 can be deposited onto the carrier layer 122, for example. By way of example, the second sacrificial layer 124 can be a silicon oxide layer, an aluminum layer, a titanium layer or a copper layer.

Figure 14:
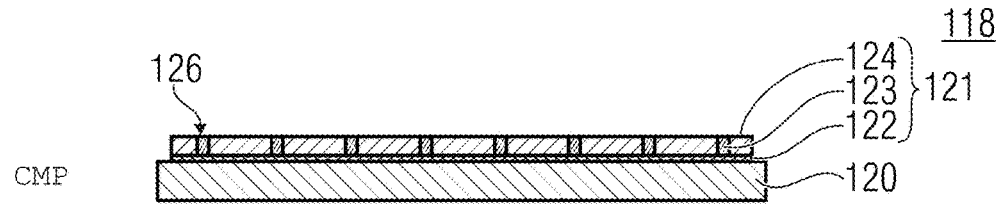
FIG. 14 shows a schematic sectional view of an intermediate product of the method for producing a thin-film layer after a step of at least partly removing the second sacrificial layer as far as the carrier layer on the elevations of the first sacrificial layer in order to obtain the areas in which the carrier layer is exposed.

FIG. 14 shows a schematic sectional view of an intermediate product 118 of the method for producing a thin-film layer after a step of at least partly removing the second sacrificial layer 124 as far as the carrier layer 122 on the elevations 127 of the first sacrificial layer 123 in order to obtain the areas 126 in which the carrier layer 122 is exposed. The second sacrificial layer 124 can be removed for example as far as the carrier layer 122 on the elevations 127 of the first sacrificial layer 123 by means of a planarization method, such as e.g. chemical mechanical polishing, in order to obtain the areas 126 in which the carrier layer 122 is exposed. By virtue of the fact that the carrier layer 122 is exposed only in the areas 126, for example less than 40% (or 30%, or 20%, or 15%, or 10%, or 5%) of the carrier layer 122 can be exposed, i.e. not be covered by the sacrificial layer 124.

Figure 15:
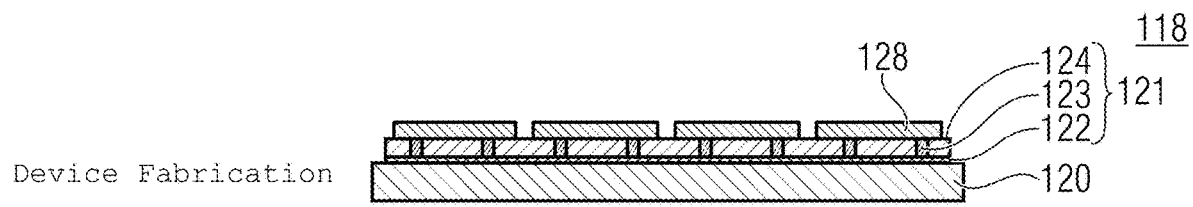
FIG. 15 shows a schematic sectional view of an intermediate product of the method for producing a thin-film layer after the step of providing a thin-film layer on the structured sacrificial layer and, in the areas of the sacrificial layer emits the carrier layer in which is exposed, on the carrier layer.

FIG. 15 shows a schematic sectional view of an intermediate product 118 of the method for producing a thin-film layer after step 106 of providing a thin-film layer 128 on the structured sacrificial layer 124 and, in the areas 126 of the sacrificial layer 124 in which the carrier layer 122 is exposed, on the carrier layer 122. The thin-film layer 128 can be deposited for example onto the structured sacrificial layer 124 and the exposed areas of the carrier layer 122. The thin-film layer 128 can have a thickness of less than 100 µm or 70 µm, or 50 µm, or 30 µm, or 20 µm, or 10 µm, or 5 µm.

As can be discerned in FIG. 15, the thin-film layer 128 can optionally be structured in order to obtain a structured thin-film layer 128. The thin-film layer 128 can be structured for example by means of a photolithographic method and subsequent etching.

By way of example, the thin-film layer 128 can be a membrane or a filter, for example of a microsystem (MEMS=microelectromechanical system). The microsystem can be produced on the thin-film layer 128, for example, such that the thin-film layer 128 is part of the microsystem, as can be discerned in FIG. 16.

Figure 16:
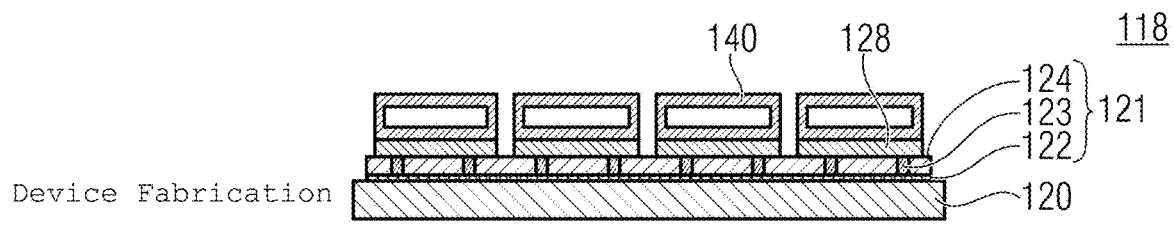
FIG. 16 shows a schematic sectional view of an intermediate product of the method for producing after an optional step of producing microsystems on the structured thin-film layer, such that the thin-film layer is part of the microsystems.

FIG. 16 shows a schematic sectional view of an intermediate product 118 of the method for producing a thin-film layer after an optional step of producing microsystems 140 on the structured thin-film layer 128, such that the thin-film layer is part of the microsystems 140.

By way of example, a Si wafer (e.g. 100 µm thick) can be applied on a polymer material on the top side (wafer bonding), whereupon the silicon material is processed and then debonded.

By way of example, the processed silicon MEMS elements 140 can be arranged above the thin-film layer 128 (bond layer, e.g. SU8 polymer), as can be discerned in FIG. 16. The MEMS components 140, with the associated bond layer area, can then be debonded from the carrier wafer and incorporated in the application.

Figure 17:
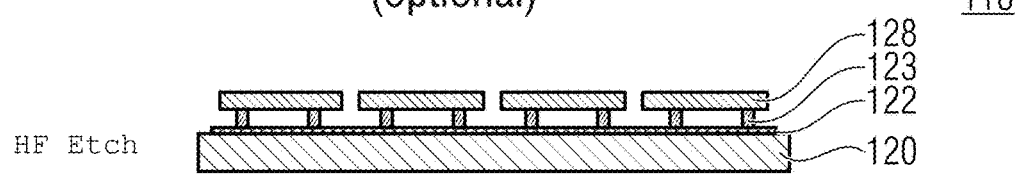
FIG. 17 shows a schematic sectional view of an intermediate product of the method for producing a thin-film layer after the step of at least partly removing the sacrificial layer proceeding from the thin-film layer in order to eliminate a contact between the thin-film layer and the sacrificial layer at least in areas, such that the thin-film layer is carried principally only by the carrier layer.

FIG. 17 shows a schematic sectional view of an intermediate product 118 of the method for producing a thin-film layer after step 108 of at least partly removing the second sacrificial layer 124 proceeding from the thin-film layer 128 (=in the substrate depth direction) in order to eliminate a contact between the thin-film layer 128 and the second sacrificial layer 124 at least in areas, such that the thin-film layer 128 is carried principally only by the carrier layer 122. While the thin-film layer is still in contact with the carrier layer 122, the contact between the thin-film layer 128 and the second sacrificial layer 124 has thus been eliminated for the most part by partly removing the sacrificial layer 124 proceeding from the thin-film layer 128.

As can be discerned in FIG. 17, the thin-film layer 128 is thus carried only (i.e. primarily or principally) by the carrier layer 122.

By way of example, the second sacrificial layer 124 can be eliminated at least in areas by means of an HF etch (HF=hydrofluoric acid) proceeding from the thin-film layer 128.

Figure 18:
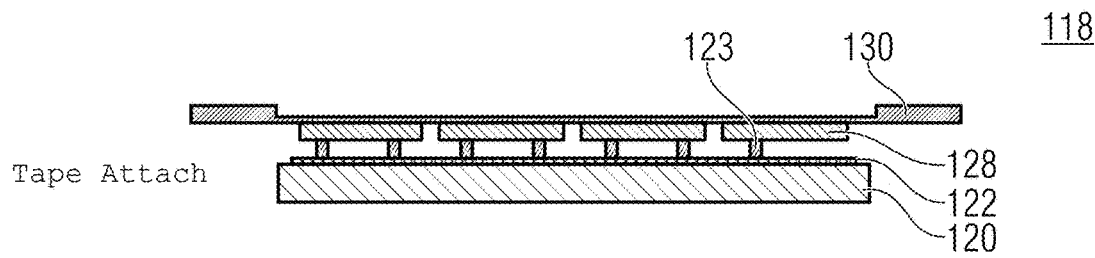
FIG. 18 shows a schematic sectional view of an intermediate product of the method for producing a thin-film layer after the step of providing an at least single-sided-adhesive transfer carrier layer on the thin-film layer, such that the thin-film layer adheres to the transfer carrier layer.

FIG. 18 shows a schematic sectional view of an intermediate product 118 of the method for producing a thin-film layer after the step of providing an at least single-sided-adhesive transfer carrier layer 130 on the thin-film layer 128, such that the thin-film layer 128 adheres to the transfer carrier layer 130. By way of example, the transfer carrier layer 130 can comprise adhesive or an adhesive layer at a side facing the thin-film layer 128. By way of example, the transfer carrier layer 130 can be an adhesive tape.

If microsystems 140 were produced on the thin-film layer 128 (see FIG. 16), the transfer carrier layer 130 can, of course, be provided on the microsystems 140, such that the transfer carrier layer 130 adheres to the microsystems 140.

Figure 19:
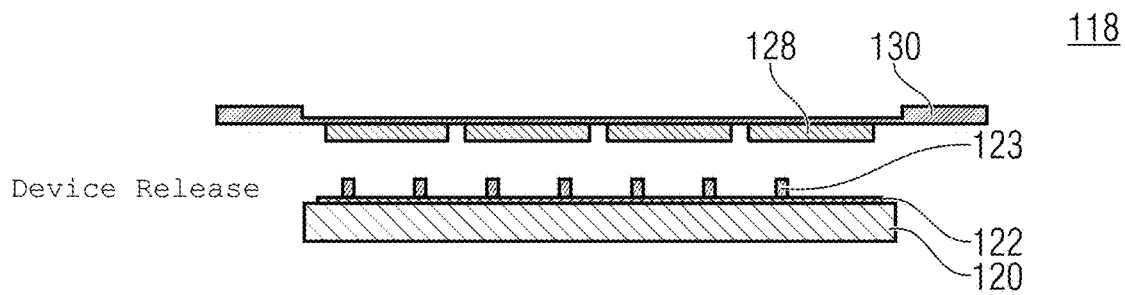
FIG. 19 shows a schematic sectional view of an intermediate product of the method for producing a thin-film layer after the step of detaching the thin-film layer from the carrier layer.

FIG. 19 shows a schematic sectional view of an intermediate product 118 of the method for producing a thin-film layer after step no of detaching the thin-film layer 128 from the carrier layer 122. As can be discerned in FIG. 19, the transfer carrier layer 130 can be detached in order to detach the thin-film layer 128 adhering to the transfer carrier layer 130 from the carrier layer 122.

If microsystems 140 were produced on the thin-film layer 128 (see FIG. 16), the microsystems 140 can, of course, be detached together with the thin-film layer, for example by means of the transfer carrier layer 130.

In the second exemplary embodiment, it is possible to arrange the connection structures between the components, e.g. mechanical screen elements or filter structures or else MEMS elements, at positions in the frame area, i.e. outside the active or sensitive areas. The aim of the procedure is to subject the sensitive structures, e.g. filter elements, MEMS structures, to the lowest possible mechanical loads both when producing the components and when debonding them from the carrier wafer or when applying them to the final application.

In the second exemplary embodiment, it is possible to provide the connection extensions on the carrier wafer (e.g. silicon substrate) for exemplary embodiments with the components.

In exemplary embodiments, a sacrificial layer can be deposited on a carrier wafer. On said sacrificial layer it is possible to define areas where an adhesion force remains high and other areas where the adhesion force can be reduced to zero by a chemical treatment, e.g. by undercutting by HF. After the chemical treatment, the device can adhere to the carrier wafer only by means of the high force areas. An adhesive tape can be attached to the devices. The devices can be torn away from the carrier wafer. The high force areas can be torn away for example at the interface.

In exemplary embodiments, substantially no production steps (processes) are carried out at open structures (e.g. filter structures, MEMS elements, etc.). There is substantially no need for any mechanical force during debonding and no need for any chemical (e.g. water) during debonding of the sensitive structures from the carrier wafer that might have a negative effect on the sensitive elements. Only a wet-chemical process takes place during exposing (releasing or removing a sacrificial material layer), but mechanical forces acting on the sensitive areas of the components do not occur.

In exemplary embodiments, the following material combinations can be used for the high force areas/low force areas, wherein the release interface and the release chemical can be varied:

(1) Sacrificial layer: silicon oxide
High force area: silicon nitride
Low force area: silicon oxide
Release interface: polyimide-silicon oxide
Release chemical: HF
(2) Sacrificial layer: Al
High force area: silicon nitride
Low force area: Al
Release interface: polyimide-Al
Release chemical: HF
(3) Sacrificial layer: titanium
High force area: silicon nitride
Low force area: titanium
Release interface: polyimide-titanium
Release chemical: HF
(4) Sacrificial layer: copper
High force area: silicon nitride
Low force area: copper
Release interface: silicon nitride-copper
Release chemical: EKC265, further copper etching A further method for producing the thin-film layer is described below.

Figure 20:
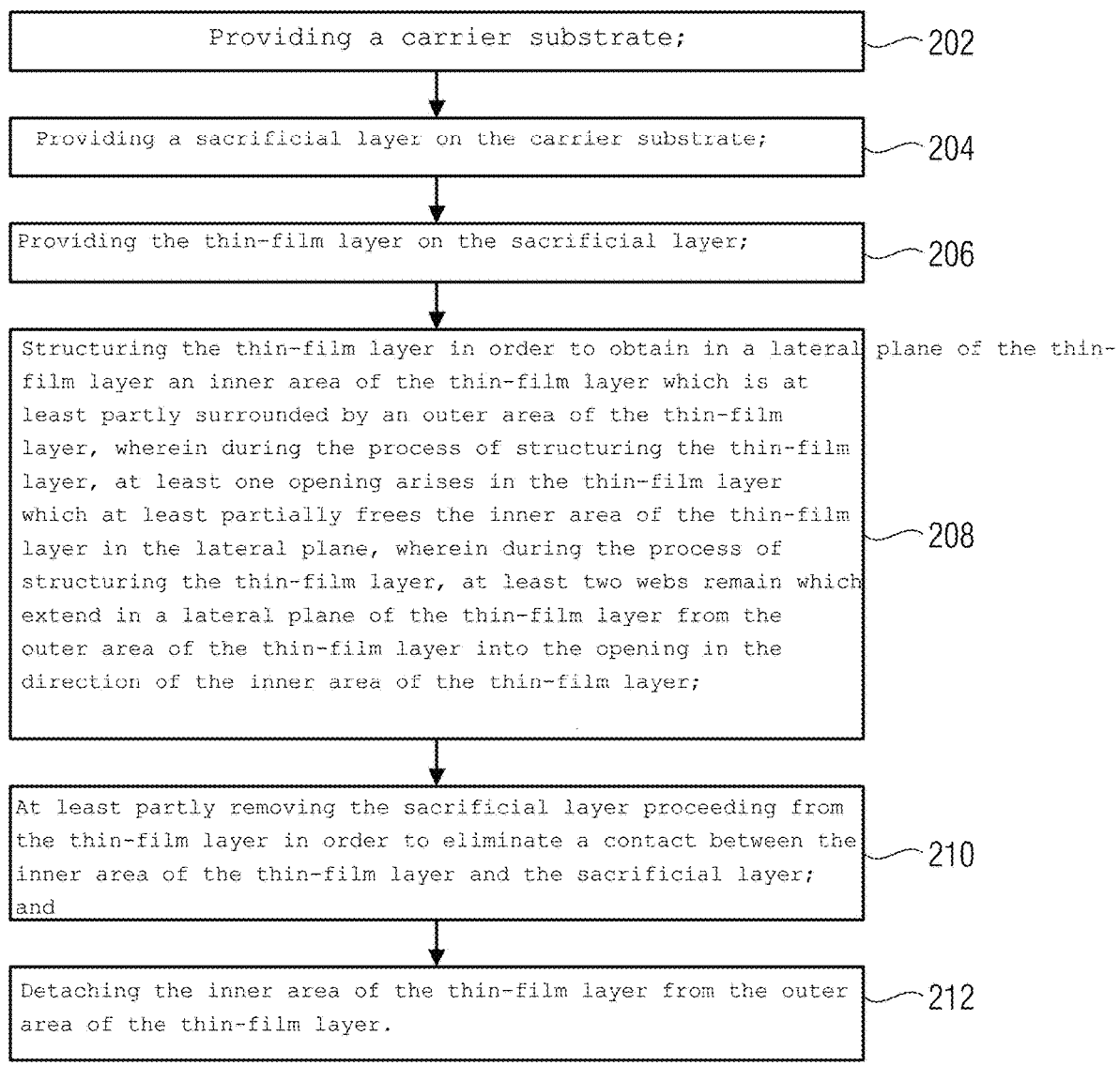
FIG. 20 shows a flow diagram of a method for producing a thin-film layer.

FIG. 20 shows a flow diagram of a method 200 for producing a thin-film layer. The method 200 comprises a step of providing 202 a carrier substrate. Furthermore, the method 200 comprises a step 204 of providing a sacrificial layer on the carrier substrate. Furthermore, the method 200 comprises a step 206 of providing the thin-film layer on the sacrificial layer. Furthermore, the method 200 comprises a step 208 of structuring the thin-film layer in order to obtain in a lateral plane of the thin-film layer an inner area of the thin-film layer which is at least partly surrounded by an outer area of the thin-film layer, wherein during the process of structuring the thin-film layer, at least one opening arises in the thin-film layer which at least partially frees the inner area of the thin-film layer in the lateral plane, wherein during the process of structuring the thin-film layer, at least two webs remain which extend in a lateral plane of the thin-film layer from the outer area of the thin-film layer into the opening in the direction of the inner area of the thin-film layer. Furthermore, the method 200 comprises a step 210 of at least partly removing the sacrificial layer proceeding from the thin-film layer in order to eliminate a contact between the inner area of the thin-film layer and the sacrificial layer. Furthermore, the method 200 comprises a step 212 of detaching the inner area of the thin-film layer from the outer area of the thin-film layer.

Exemplary embodiments of the method 200 are described in detail below with reference to FIGS. 21 to 26, which show schematic sectional views of intermediate products of producing a thin-film layer after the various method steps.

Figure 21:
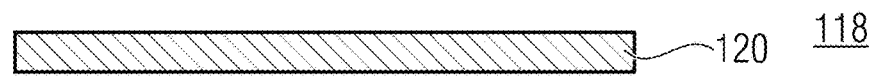
FIG. 21 shows a schematic sectional view of an intermediate product of the method for producing a thin-film layer after the step of providing the carrier substrate.

FIG. 21 shows a schematic sectional view of an intermediate product 118 of the method for producing a thin-film layer after step 202 of providing the carrier substrate 120. The carrier substrate 120 can be for example a semiconductor substrate or semiconductor wafer, such as e.g. a silicon substrate or silicon wafer.

Figure 22:
FIG. 22 shows a schematic sectional view of an intermediate product of the method for producing a thin-film layer after the step of providing the sacrificial layer on the carrier substrate.

FIG. 22 shows a schematic sectional view of an intermediate product 118 of the method for producing a thin-film layer after step 204 of providing the sacrificial layer 124 on the carrier substrate 120. The sacrificial layer 124 can be a silicon oxide layer, for example.

Figure 23:
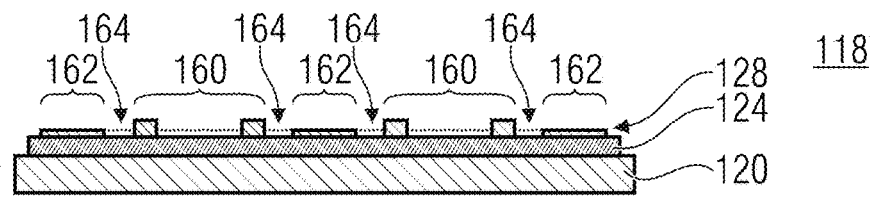
FIG. 23 shows a schematic sectional view of an intermediate product of the method for producing a thin-film layer after the step of providing the thin-film layer on the sacrificial layer and after the step of structuring the thin-film layer.

FIG. 23 shows a schematic sectional view of an intermediate product 118 of the method for producing a thin-film layer after step 206 of providing the thin-film layer 128 on the sacrificial layer 124 and after step 208 of structuring the thin-film layer 128.

As is indicated in FIG. 23, structuring the thin-film layer 128 results, in a lateral plane of the thin-film layer 128, in an inner area 160 of the thin-film layer 128 which is at least partly surrounded by an outer area 162 of the thin-film layer 128, wherein during the process of structuring the thin-film layer, at least one opening arises in the thin-film layer which at least partially frees the inner area 160 of the thin-film layer in the lateral plane, wherein during the process of structuring the thin-film layer, at least two webs 164 remain which extend in a lateral plane of the thin-film layer 128 from the outer area 162 of the thin-film layer 128 into the opening in the direction of the inner area 160 of the thin-film layer 128.

The thin-film layer 128 can be deposited onto the sacrificial layer 124, for example. The thin-film layer 128 can have a thickness of less than 100 μm (or 70 μm, or 50 μm, or 30 μm, or 20 μm, or 10 μm, or 5 μm).

The thin-film layer 128 can be structured for example by means of a photolithographic method and subsequent etching.

By way of example, the thin-film layer 128 can be a membrane or a filter, for example of a microsystem (MEMS=microelectromechanical system). The microsystem can be produced on the thin-film layer 128, for example, such that the thin-film layer 128 is part of the microsystem.

By way of example, the thin-film layer can be a polyimide layer or a combination of polyimide layer and SU 8 layer.

Figure 24:
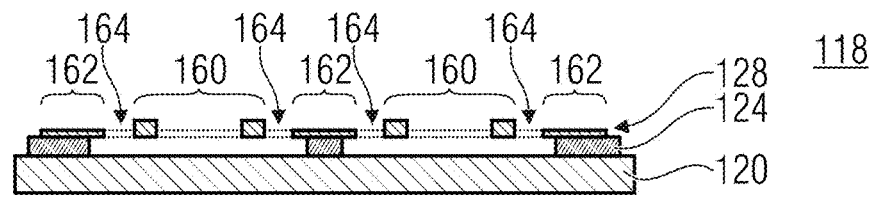
FIG. 24 shows a schematic sectional view of an intermediate product of the method for producing a thin-film layer after the step of at least partly removing the sacrificial layer proceeding from the thin-film layer in order to eliminate a contact between the inner area of the thin-film layer and the sacrificial layer.

FIG. 24 shows a schematic sectional view of an intermediate product 118 of the method for producing a thin-film layer after step 210 of at least partly removing the sacrificial layer 124 proceeding from the thin-film layer 128 (=in the substrate depth direction) in order to eliminate a contact between the inner area 160 of the thin-film layer 128 and the sacrificial layer 124.

As can be discerned in FIG. 13, the inner area 160 of the thin-film layer 128, after at least partly removing the sacrificial layer below the inner area 160 of the thin-film layer 128, is carried only by the at least two webs 164 of the outer area 162 of the thin-film layer 128.

By way of example, the sacrificial layer 124 can be at least partly removed proceeding from the thin-film layer 128 by means of an HF etch (HF=hydrofluoric acid).

Step 212 of detaching the inner area 160 of the thin-film layer 128 from the outer area 162 of the thin-film layer 128 is explained in greater detail below with reference to FIGS. 25 and 26.

Figure 25:
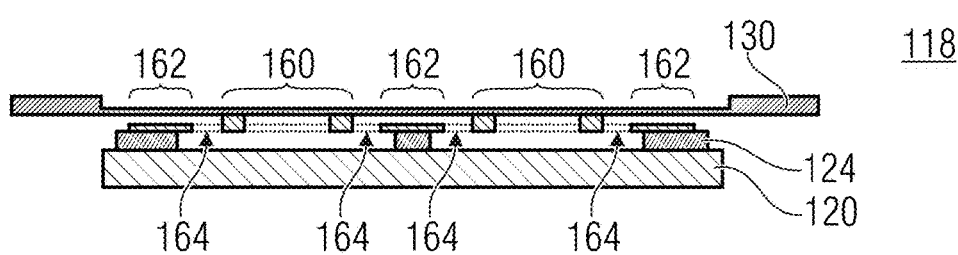
FIG. 25 shows a schematic sectional view of an intermediate product of the method for producing a thin-film layer after the step of providing an at least single-sided-adhesive transfer carrier layer on the thin-film layer, such that the inner area of the thin-film layer adheres to the transfer carrier layer.

FIG. 25 shows a schematic sectional view of an intermediate product 118 of the method for producing a thin-film layer after the step of providing an at least single-sided-adhesive transfer carrier layer 130 on the thin-film layer 128, such that the inner area 160 of the thin-film layer 128 adheres to the transfer carrier layer 130. By way of example, the transfer carrier layer 130 can comprise adhesive or an adhesive layer at a side facing the thin-film layer 128. By way of example, the transfer carrier layer 130 can be an adhesive tape.

Figure 26:
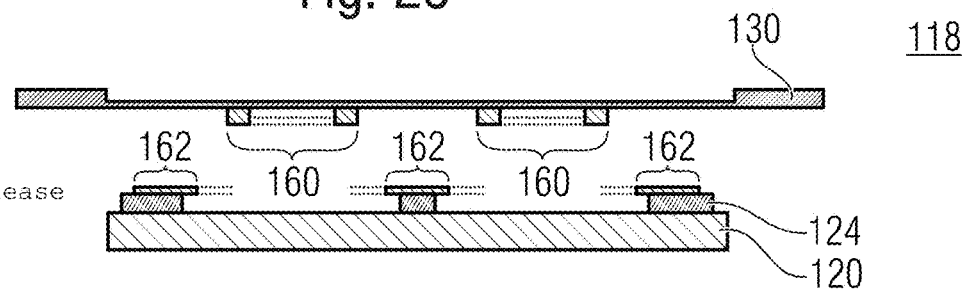
FIG. 26 shows a schematic sectional view of an intermediate product of the method for producing a thin-film layer after the step of detaching the transfer carrier layer in order to detach the inner area of the thin-film layer adhering to the transfer carrier layer from the outer area of the thin-film layer.

FIG. 26 shows a schematic sectional view of an intermediate product 118 of the method for producing a thin-film layer after the step of detaching the transfer carrier layer 130 in order to detach the inner area 160 of the thin-film layer 128 adhering to the transfer carrier layer 130 from the outer area 162 of the thin-film layer 128.

During the process of detaching the inner area 160 of the thin-film layer 128 from the outer area 162 of the thin-film layer 128, the at least two webs 164 of the outer area 162 of the thin-film layer 128 can break.

Step 208 of structuring the thin-film layer is explained in greater detail below with reference to FIGS. 27 to 30. Furthermore, further optional steps of the method 200 are explained and different configurations (designs) of the horizontal holding structure are shown in FIGS. 27 and 30.

Figure 27C:
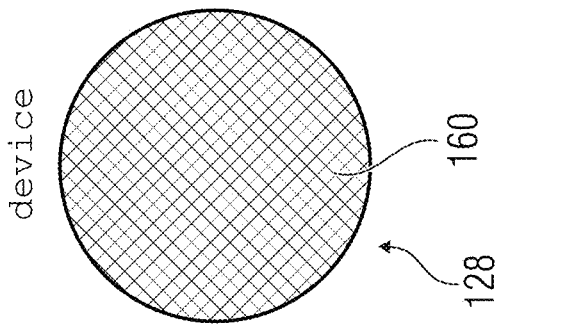
FIG. 27c shows a schematic plan view of the inner area of the thin-film layer after the step of detaching the inner area of the thin-film layer from the outer area of the thin-film layer.
Figure 27B:
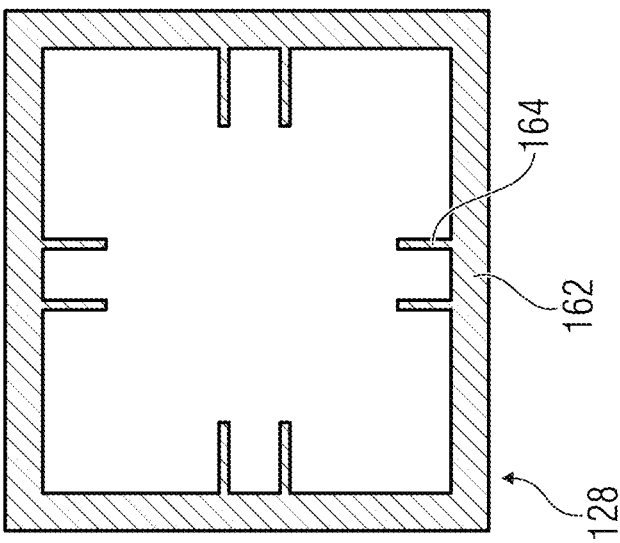
FIG. 27b shows a schematic plan view of the outer area of the thin-film layer after the step of detaching the inner area of the thin-film layer from the outer area of the thin-film layer.
Figure 27A:
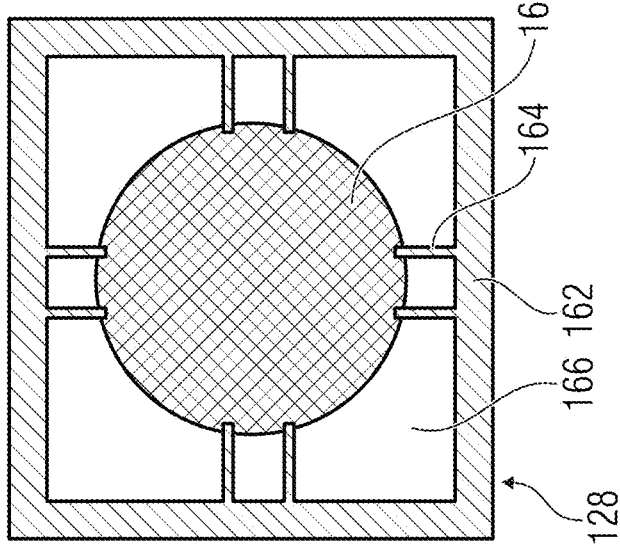
FIG. 27a shows a schematic plan view of the thin-film layer after the step of structuring the thin-film layer and the step of providing the carrier structure.

FIG. 27a shows a schematic plan view of the thin-film layer 128 after step 208 of structuring the thin-film layer 128. As can be discerned in FIG. 27a, structuring the thin-film layer 128 results, in a lateral plane of the thin-film layer 128, in the inner area 160 of the thin-film layer 128 which is surrounded by the outer area 162 of the thin-film layer 128, wherein during the process of structuring the thin-film layer 128, at least two openings 166 can arise in the thin-film layer 128 which partially (i.e. not completely) free the inner area 160 of the thin-film layer 128 in the lateral plane, wherein during the process of structuring the thin-film layer 128, at least two webs 164 remain between the openings 166, which connect the inner area 160 of the thin-film layer 128 to the outer area 162 of the thin-film layer 128.

By way of example, during the process of structuring the thin-film layer 128, the inner area 160 of the thin-film layer 128 can be only partly separated from the outer area 162 of the thin-film layer 128, that is to say that although openings 166 arise between the inner area 160 of the thin-film layer 128 and the outer area 162 of the thin-film layer 128, these are still connected by (thin) webs 164, such that after removing the sacrificial layer 124 at least below the inner area 160 of the thin-film layer 128 and at least partly below the at least two webs 164, e.g. by undercutting, the inner area 160 of the thin-film layer is carried by the at least two webs 164 of the outer area 162 of the thin-film layer 128.

The outer area 162 of the thin-film layer 128 can form for example a frame or a frame structure 162 that surrounds the inner area 160 of the thin-film layer 128. Although in FIG. 27a the frame structure 162 completely surrounds the inner area 160 of the thin-film layer 128, it is equally possible for the frame structure 162 only partly to surround the inner area 160 of the thin-film layer 128, for example at opposite sides of the inner area 160 of the thin-film layer 128.

The inner area 160 of the thin-film layer 128 can be for example a membrane or a filter, e.g. for a microsystem (MEMS). By way of example, the microsystem can be produced on the inner area 160 of the thin-film layer 128, wherein during the process of detaching the inner area 160 of the thin-film layer 128, the microsystem can be detached together with the inner area 160 of the thin-film layer.

FIG. 27b shows a schematic plan view of the outer area 162 of the thin-film layer 128 after step 212 of detaching the inner area 160 of the thin-film layer 128 from the outer area 162 of the thin-film layer 128.

During the process of detaching the inner area 160 of the thin-film layer 128 from the outer area 162 of the thin-film layer 128, the webs 164 of the outer area 162 of the thin-film layer 128 can break.

FIG. 27c shows a schematic plan view of the inner area 160 of the thin-film layer 128 after step 212 of detaching the inner area 160 of the thin-film layer 128 from the outer area 162 of the thin-film layer 128.

Figure 28C:
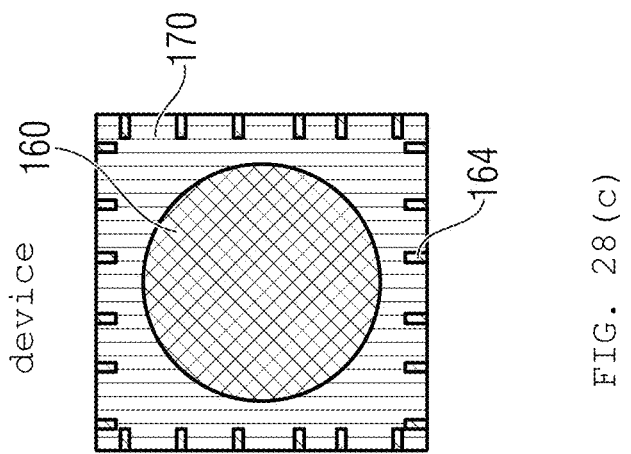
FIG. 28c shows a schematic plan view of the inner area of the thin-film layer after the step of detaching the inner area of the thin-film layer from the outer area of the thin-film layer.
Figure 28B:
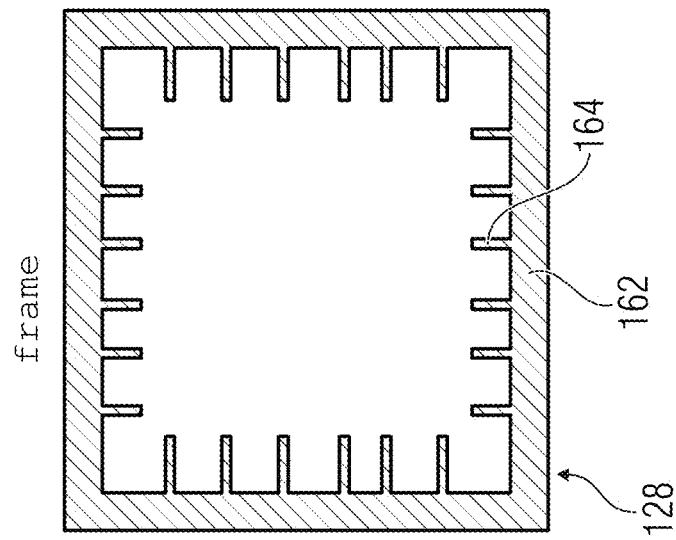
FIG. 28b shows a schematic plan view of the outer area of the thin-film layer after the step of detaching the inner area of the thin-film layer from the outer area of the thin-film layer.
Figure 28A:
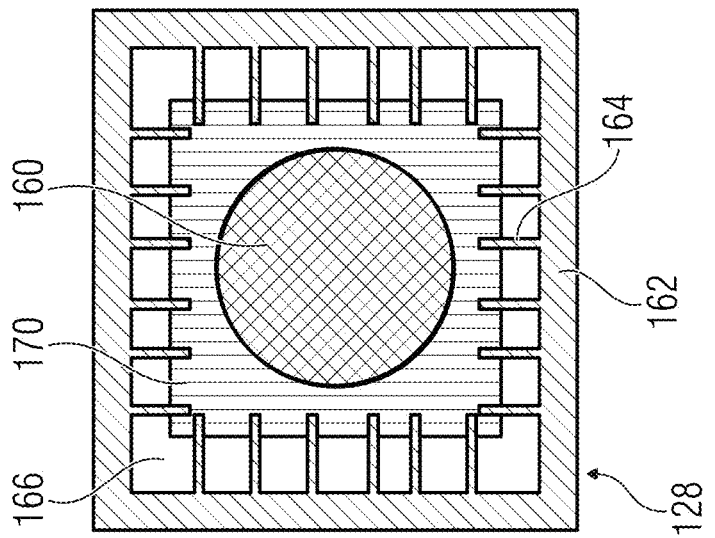
FIG. 28a shows a schematic plan view of the thin-film layer after the step of structuring the thin-film layer and the step of providing the carrier structure.

FIG. 28a shows a schematic plan view of the thin-film layer 128 after step 208 of structuring the thin-film layer 128. As can be discerned in FIG. 28a, structuring the thin-film layer 128 results, in a lateral plane of the thin-film layer 128, in the inner area 160 of the thin-film layer 128 which is surrounded by the outer area 162 of the thin-film layer 128, wherein during the process of structuring the thin-film layer 128, at least one opening 166 arises in the thin-film layer 128 which frees the inner area 160 of the thin-film layer 128 in the lateral plane, wherein during the process of structuring the thin-film layer 128, at least two webs 164 remain which extend in the lateral plane of the thin-film layer 128 from the outer area 162 of the thin-film layer 128 into the opening 166 in the direction of the inner area 160 of the thin-film layer 128.

As can be discerned in FIG. 28a, the inner area 160 of the thin-film layer 128 can be completely freed from the outer area 162 of the thin-film layer 128, that is to say that after structuring the thin-film layer 128, the inner area 160 of the thin-film layer 128 can be completely separated from the outer area 162 of the thin-film layer 128, and also (initially) not be connected to the outer area 162 of the thin-film layer 128 via the at least two webs 164 extending into the opening 166 in the direction of the inner area 160 of the thin-film layer 128.

After structuring the thin-film layer 128, a carrier layer can be provided (e.g. deposited) on the thin-film layer 128 and be structured in order to obtain a carrier structure 170 extending over the inner area 160 of the thin-film layer 128 and at least partly over the webs 164, such that the carrier structure 170 connects the inner area 160 of the thin-film layer 128 to the webs 164.

By way of example, after structuring the thin-film layer 128, the carrier layer can be provided (deposited) on the thin-film layer 128 and on the sacrificial layer 124 in the region of the opening 166 of the thin-film layer 128.

The carrier layer can have a thickness of more than 30 µm (or 40 µm or 50 µm). By way of example, the thickness of the carrier layer can be in the range of 40 µm to 100 µm. The carrier layer can be a polymer layer, such as e.g. an SU-8 layer.

After structuring the carrier layer, the carrier structure can thus extend at least partly over the opening 166 between the inner area 160 of the thin-film layer 128 and the outer area 162 of the thin-film layer 128, e.g. between the areas of the at least two webs 164.

By way of example, as can be discerned in FIG. 28a, the carrier layer can be structured such that the resulting carrier structure (or structured carrier layer) covers the inner area 160 of the thin-film layer 128 and extends as far as the at least two webs 164, such that the inner area 160 of the thin-film layer 128 is connected to the at least two webs 164 via the carrier structure 170, such that after removing the sacrificial layer 124 below the inner area 160 of the thin-film layer 128 and at least partly below the at least two webs 164, e.g. by undercutting, the inner area 160 of the thin-film layer 128 is carried by the at least two webs 164 of the outer area 162 of the thin-film layer 128 by way of the carrier structure 170.

After step 210 of at least partly removing the sacrificial layer 124, the inner area 160 of the thin-film layer 128 can thus be carried by the at least two webs 164 of the outer area 162 of the thin-film layer 128 by way of the carrier structure 170. As can be discerned in FIG. 28a, the carrier structure 170 can extend at least partly over the at least two webs 164, such that the carrier structure 170 bears on the at least two webs 164 of the outer area 162 of the thin-film layer 128.

By way of example, the sacrificial layer 124 can be at least partly removed by etching proceeding from the thin-film layer 128 in order to eliminate the contact between the inner area 160 of the thin-film layer 128 and the sacrificial layer 124. By way of example, the sacrificial layer 124 can be undercut in the area below the inner area 160 of the thin-film layer 128, while a top side of the inner area 160 of the thin-film layer is protected by the carrier structure 170 during etching, such that the inner area 160 of the thin-film layer 128 is undercut proceeding from the opening 166 between the inner area 160 of the thin-film layer 128 and the outer area 162 of the thin-film layer 128. Here the carrier layer (or carrier structure 170) and/or the sacrificial layer 124 can have in each case a higher etching rate than the thin-film layer 128.

During step 110 of detaching the inner area 160 of the thin-film layer 128, the carrier structure 170 can be detached together with the inner area 160 of the thin-film layer 128.

The outer area 162 of the thin-film layer 128 can form for example a frame or a frame structure 162 that surrounds the inner area 160 of the thin-film layer 128. Although in FIG. 28a the frame structure 162 completely surrounds the inner area 160 of the thin-film layer 128, it is equally possible for the frame structure 162 only partly to surround the inner area 160 of the thin-film layer 128, for example at opposite sides of the inner area 160 of the thin-film layer 128.

The inner area 160 of the thin-film layer 128 can be for example a membrane or a filter, e.g. for a microsystem (MEMS). By way of example, a microsystem can be produced on the inner area 160 of the thin-film layer 128 before providing the carrier layer, wherein during the process of detaching the inner area 160 of the thin-film layer 128, the microsystem can be detached together with the carrier structure 170 and the inner area 160 of the thin-film layer.

FIG. 28b shows a schematic plan view of the outer area 162 of the thin-film layer 128 after step 212 of detaching the inner area 160 of the thin-film layer 128 from the outer area 162 of the thin-film layer 128.

During the process of detaching the inner area 160 of the thin-film layer 128 from the outer area 162 of the thin-film layer 128, the webs 164 of the outer area 162 of the thin-film layer 128 can break.

FIG. 28c shows a schematic plan view of the inner area 160 of the thin-film layer 128 after step 212 of detaching the inner area 160 of the thin-film layer 128 from the outer area 162 of the thin-film layer 128.

In other words, FIG. 28a shows the device before release, while FIG. 28b shows the frame 162 and FIG. 28c the device after release. As can be discerned in FIGS. 28a to 28c, the holding structure 164 is torn away during the release of the device. Parts of the holding structure 164 remain at the device.

Figures 29A, 29B, 29C:
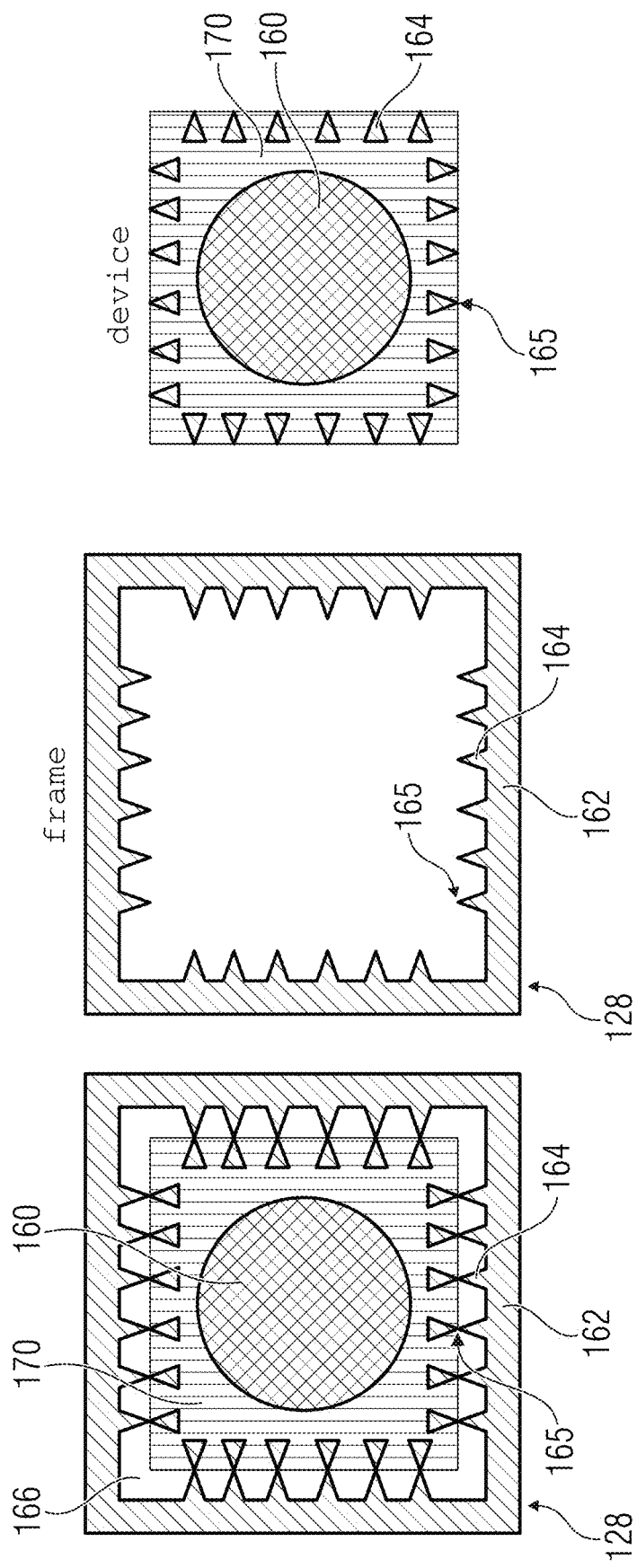
FIG. 29a shows a schematic plan view of the thin-film layer after the step of structuring the thin-film layer and the step of providing the carrier structure.
FIG. 29b shows a schematic plan view of the outer area of the thin-film layer after the step of detaching the inner area of the thin-film layer from the outer area of the thin-film layer.
FIG. 29c shows a schematic plan view of the inner area of the thin-film layer after the step of detaching the inner area of the thin-film layer from the outer area of the thin-film layer.

FIG. 29a shows a schematic plan view of the thin-film layer 128 after step 208 of structuring the thin-film layer 128 and the step of providing the carrier structure 170. In contrast to FIG. 28a, the thin-film layer 128 can be structured such that the at least two webs 164 each have a tapering area 165 in the center. The tapering areas 165 of the at least two webs 164 can be predetermined breaking locations 165, for example, which define the locations at which the at least two webs 164 break during the process of detaching the inner area 160 of the thin-film layer 128.

FIG. 29b shows a schematic plan view of the outer area 162 of the thin-film layer 128 after step 212 of detaching the inner area 160 of the thin-film layer 128 from the outer area 162 of the thin-film layer 128.

During the process of detaching the inner area 160 of the thin-film layer 128 from the outer area 162 of the thin-film layer 128, the webs 164 of the outer area 162 of the thin-film layer 128 can break at the predetermined breaking locations 165.

FIG. 29c shows a schematic plan view of the inner area 160 of the thin-film layer 128 after step 212 of detaching the inner area 160 of the thin-film layer 128 from the outer area 162 of the thin-film layer 128.

In other words, FIG. 29a shows the device before release, while FIG. 29b shows the frame 162 and FIG. 29c the device after release. As can be discerned in FIGS. 29a to 29c, the holding structure 164 has a double taper, that is to say that the holding structure 164 has a taper from both sides. In this case, the holding structure 164 breaks at the thinnest location.

Figures 30A, 30B, 30C:
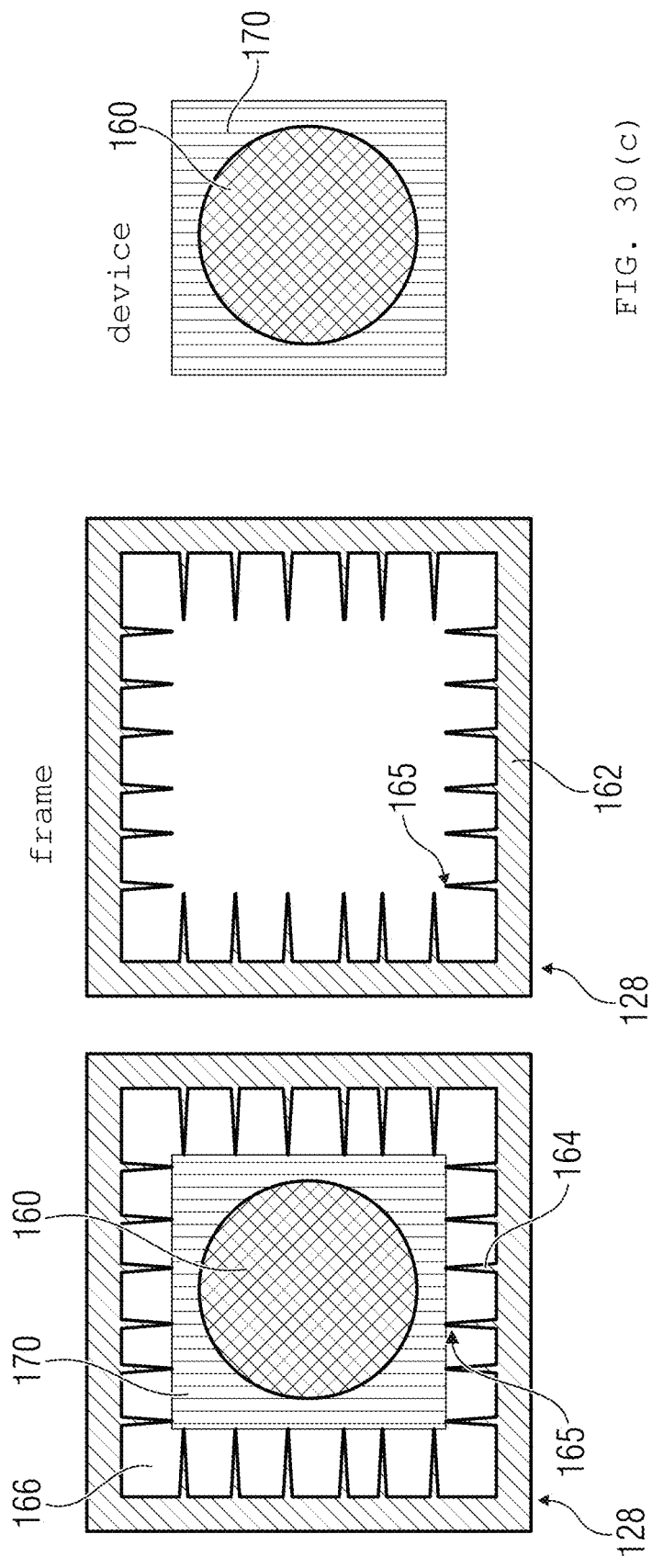
FIG. 30a shows a schematic plan view of the thin-film layer after the step of structuring the thin-film layer and the step of providing the carrier structure.
FIG. 30b shows a schematic plan view of the outer area of the thin-film layer after the step of detaching the inner area of the thin-film layer from the outer area of the thin-film layer.
FIG. 30c shows a schematic plan view of the inner area of the thin-film layer after the step of detaching the inner area of the thin-film layer from the outer area of the thin-film layer.

FIG. 30a shows a schematic plan view of the thin-film layer 128 after step 208 of structuring the thin-film layer 128 and the step of providing the carrier structure 170. In contrast to FIG. 28a, the thin-film layer 128 can be structured such that the at least two webs 164 each have a tapering area 165 at the ends. The tapering areas 165 of the at least two webs 164 can be predetermined breaking locations 165, for example, which define the locations at which the at least two webs 164 break during the process of detaching the inner area 160 of the thin-film layer 128.

FIG. 30b shows a schematic plan view of the outer area 162 of the thin-film layer 128 after step 212 of detaching the inner area 160 of the thin-film layer 128 from the outer area 162 of the thin-film layer 128.

During the process of detaching the inner area 160 of the thin-film layer 128 from the outer area 162 of the thin-film layer 128, the webs 164 of the outer area 162 of the thin-film layer 128 can break at the predetermined breaking locations 165.

FIG. 30c shows a schematic plan view of the inner area 160 of the thin-film layer 128 after step 212 of detaching the inner area 160 of the thin-film layer 128 from the outer area 162 of the thin-film layer 128.

In other words, FIG. 30a shows the device before release, while FIG. 30b shows the frame 162 and FIG. 30c the device after release. As can be discerned in FIGS. 30a to 30c, the holding structure 164 has a single taper, that is to say that the holding structure 164 has in each case a taper that becomes narrower in the direction of the device. On account of said taper, the holding structure 164 can be debonded from the device during the release of the device.

In exemplary embodiments, the following material combinations can be used for the high force areas/low force areas, wherein the release interface and the release chemical can be varied:

(1) Sacrificial layer: silicon oxide
Holding structure of the kerf: polyimide or PBO
Device frame (carrier structure): SU 8
Release interface: polyimide-silicon oxide
Release chemical: HF The material combination polyimide/SU-8 is very well suited to this method. The polyimide is used for holding the structure in the kerf and the lattice of the MEMS device. During oxide etching, the polyimide is undercut only from the left and right. It can therefore withstand long etching times before the delamination of the device. In this case, SU-8 can serve as a frame for handling the device. During oxide etching, the material can be penetrated by the etchant that attacks the SU-8/oxide interface. The delamination of the device therefore takes place much faster. As a result of this material combination, it is possible to significantly reduce the required etching time for releasing the device during oxide etching.

Figure 31:
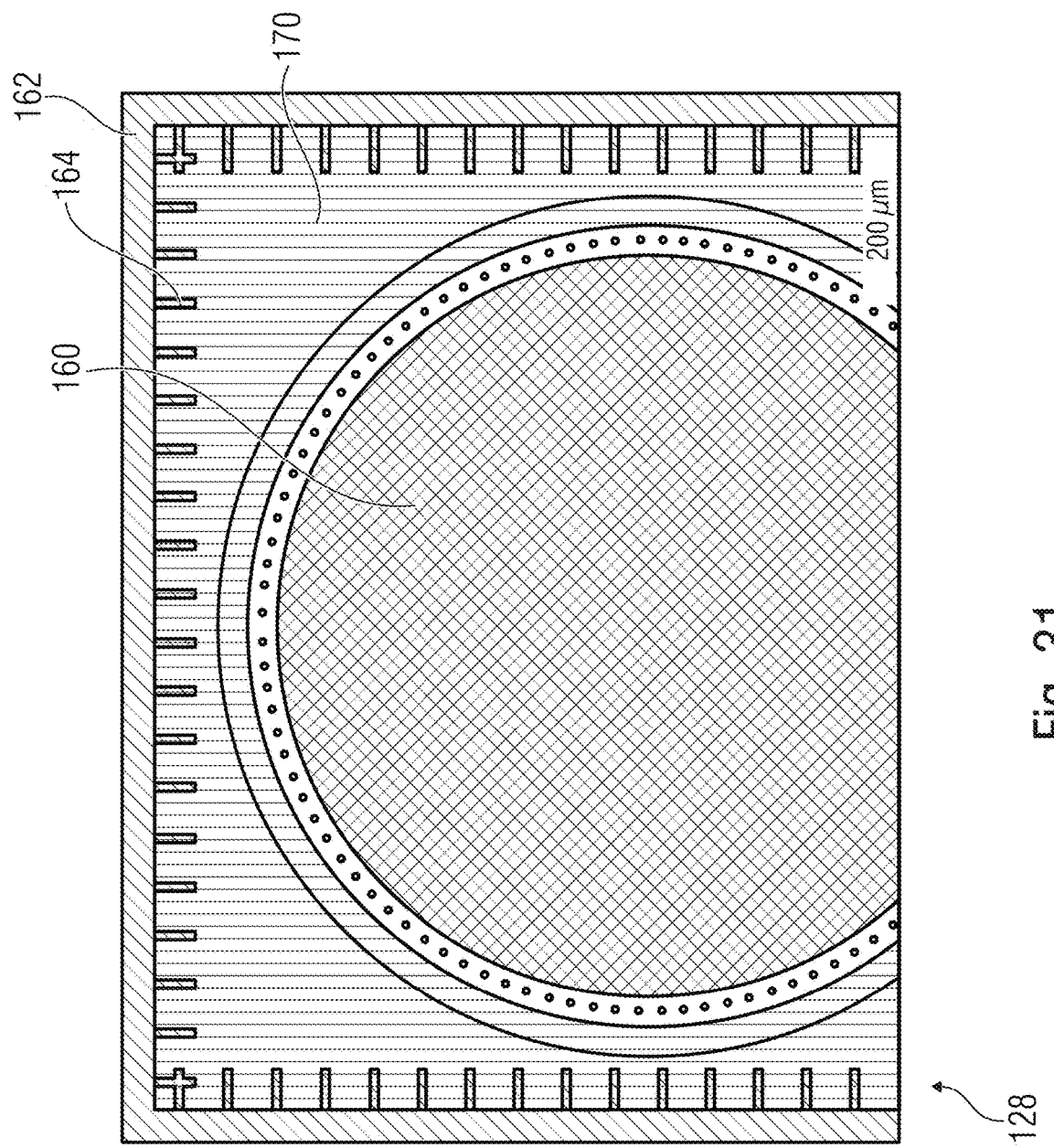
FIG. 31 shows a schematic plan view of the thin-film layer after the step of structuring the thin-film layer and the step of providing the carrier structure.

FIG. 31 shows a schematic plan view of the thin-film layer 128 after step 208 of structuring the thin-film layer 128 and the step of providing the carrier structure 170. As can be discerned in FIG. 31, structuring the thin-film layer 128 results, in a lateral plane of the thin-film layer 128, in the inner area 160 of the thin-film layer 128 which is surrounded by the outer area 162 of the thin-film layer 128, wherein during the process of structuring the thin-film layer 128, at least two webs 164 remain which extend in the lateral plane of the thin-film layer 128 from the outer area 162 of the thin-film layer 128 in the direction of the inner area 160 of the thin-film layer 128, wherein the carrier structure extends at least partly over the at least two webs 164, such that the carrier structure 170 bears on the at least two webs 164 of the outer area 162 of the thin-film layer.

The methods described herein can be used for example for producing particle filters for MEMS microphones having a filter thickness of e.g. 5 µm. In contrast to other methods, the thin filter area is not subjected to force loading during debonding from the carrier.

The methods described herein have the advantage that the clean room requirements during the assembly of cellular phones, for example, can be reduced since the MEMS microphone module is protected by a particle filter.

Although a description has been given here of exemplary embodiments in which the thin-film layer is a polyimide layer or comprises polyimide, it should be pointed out that some other material, such as e.g. silicon, can also be used instead of a polyimide layer or polyimide.

A description is given below of further exemplary embodiments which can be applied by themselves or in combination with the exemplary embodiments described above.

In exemplary embodiments, the thin-film layer 128 (e.g. a particle barrier, a membrane or a filter) can be processed on the carrier substrate (carrier wafer) 120. After processing the thin-film layer 128 or the semiconductor device (e.g. microsystem) having the thin-film layer 128, the thin-film layer 128 or the semiconductor device having the thin-film layer 128 can be released from the carrier substrate 120. In order that the thin-film layer 128, during release from the carrier substrate 120, does not stick to the carrier substrate 120 and break, an anti-sticking structure can be used in exemplary embodiments. The anti-sticking structure makes it possible to reduce a contact area with respect to the thin-film layer 128, such that the thin-film layer 128, during release from the carrier substrate 120, does not stick to the carrier substrate 120 and break.

In exemplary embodiments, before providing the sacrificial layer 124, an anti-sticking structure can be provided on the carrier substrate 120, wherein the anti-sticking structure comprises elevations (e.g. (linear) dams or dykes) extending in at least one lateral dimension along a surface of the carrier substrate 120. The anti-sticking structure can be arranged in a vertical plane below the thin-film layer 128 or the inner area 160 of the thin-film layer 128.

In exemplary embodiments, the elevations can have a width (e.g. in a lateral plane) of less than 2 µm, e.g. a width of 1 µm. Furthermore, the elevations can have a length (e.g. in a lateral plane) of more than 100 µm (or 200 µm, or 300 µm, or 400 µm, or 500 µm, or 600 µm, or 700 µm, or 800 µm), such as e.g. a length of approximately 850 µm.

In exemplary embodiments, the elevations can extend in one lateral dimension along a surface of the carrier substrate 120, wherein the elevations form a line in a lateral plane (of the elevations).

In exemplary embodiments, the elevations can extend in two lateral dimensions along a surface of the carrier substrate 120, wherein the elevations form circles in a lateral plane (of the elevations). In this case, a diameter of the circles can be greater than a diameter of the openings of a lattice structure of the thin-film layer 128 (e.g. particle barrier, membrane or filter).

On the one hand, the thin-film layer can be detached from the carrier substrate 120 by means of the anti-sticking structure after the release etch (e.g. undercutting), without the thin-film layer 128 sticking to the carrier substrate 120 and breaking. On the other hand, the specific configuration of the anti-sticking structure (elevations or lines extending in at least one lateral dimension) makes it possible to ensure that the thin-film layer does not detach easily (e.g. of its own accord) from the anti-sticking structure.

In contrast thereto, in the case of a conventional anti-sticking structure based on pyramidal pins, the thin-film layer can be moved in a lateral plane (e.g. in x- and y-directions) after the release etch (e.g. undercutting) and thus fall off easily (e.g. of its own accord) from the anti-sticking structure.

Figure 32:
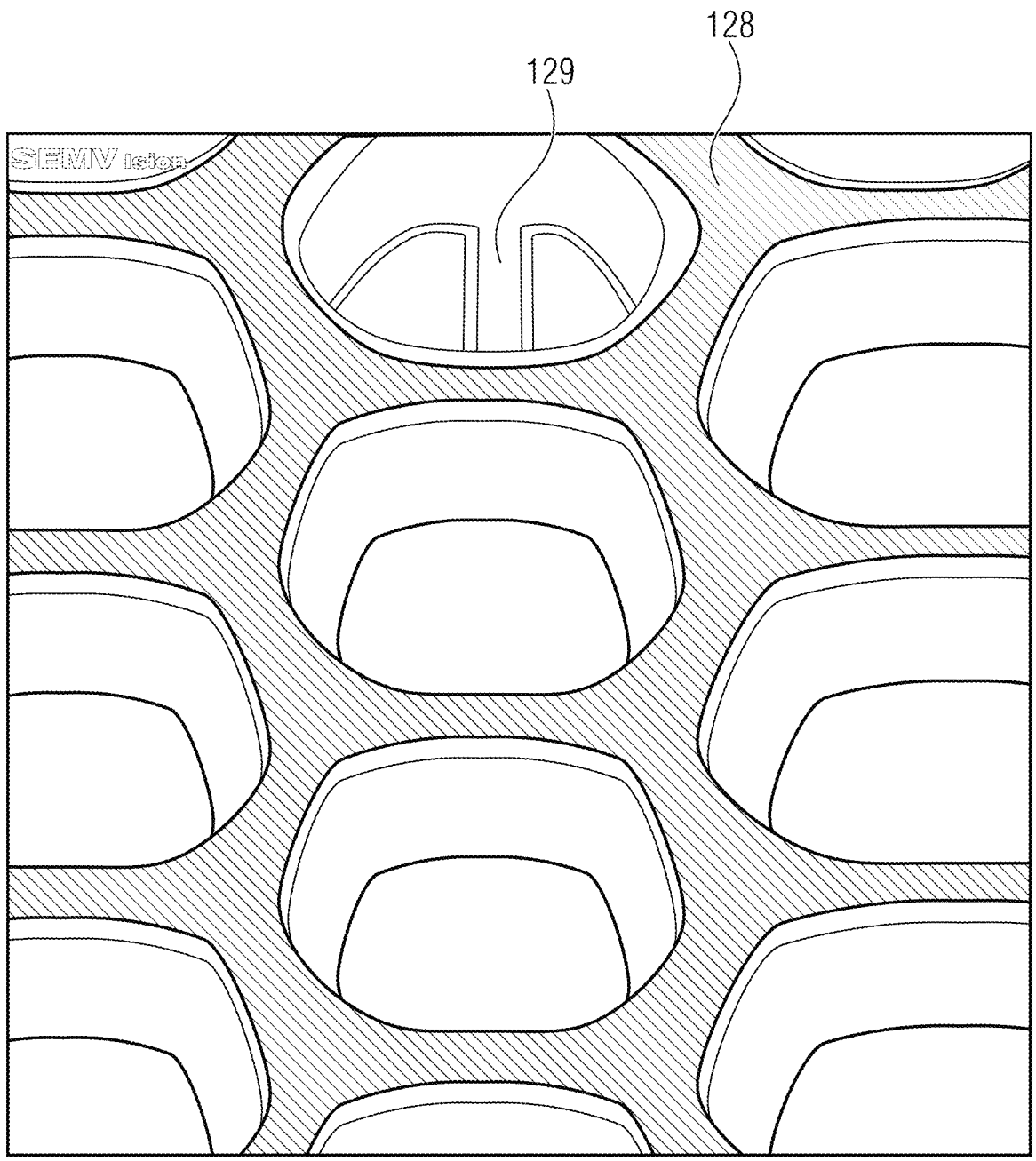
FIG. 32 shows a recording (e.g. scanning electron microscope recording) of a thin-film layer and of an anti-sticking structure having an elevation extending in one lateral dimension.

FIG. 32 shows a recording (e.g. scanning electron microscope recording) of a thin-film layer and of an anti-sticking structure 129 having an elevation extending in one lateral dimension. As can be discerned in FIG. 32, the anti-sticking structure does not have punctiform pyramids, but rather thin straight lines or linear elevations (having a width of e.g. 1 µm, and a length of ~850 µm). Alternatively, the anti-sticking structure 129 can comprise circles or circular elevations, wherein a diameter of the circles is greater than a diameter of the holes or openings of a lattice structure of the thin-film layer.

Figure 33:
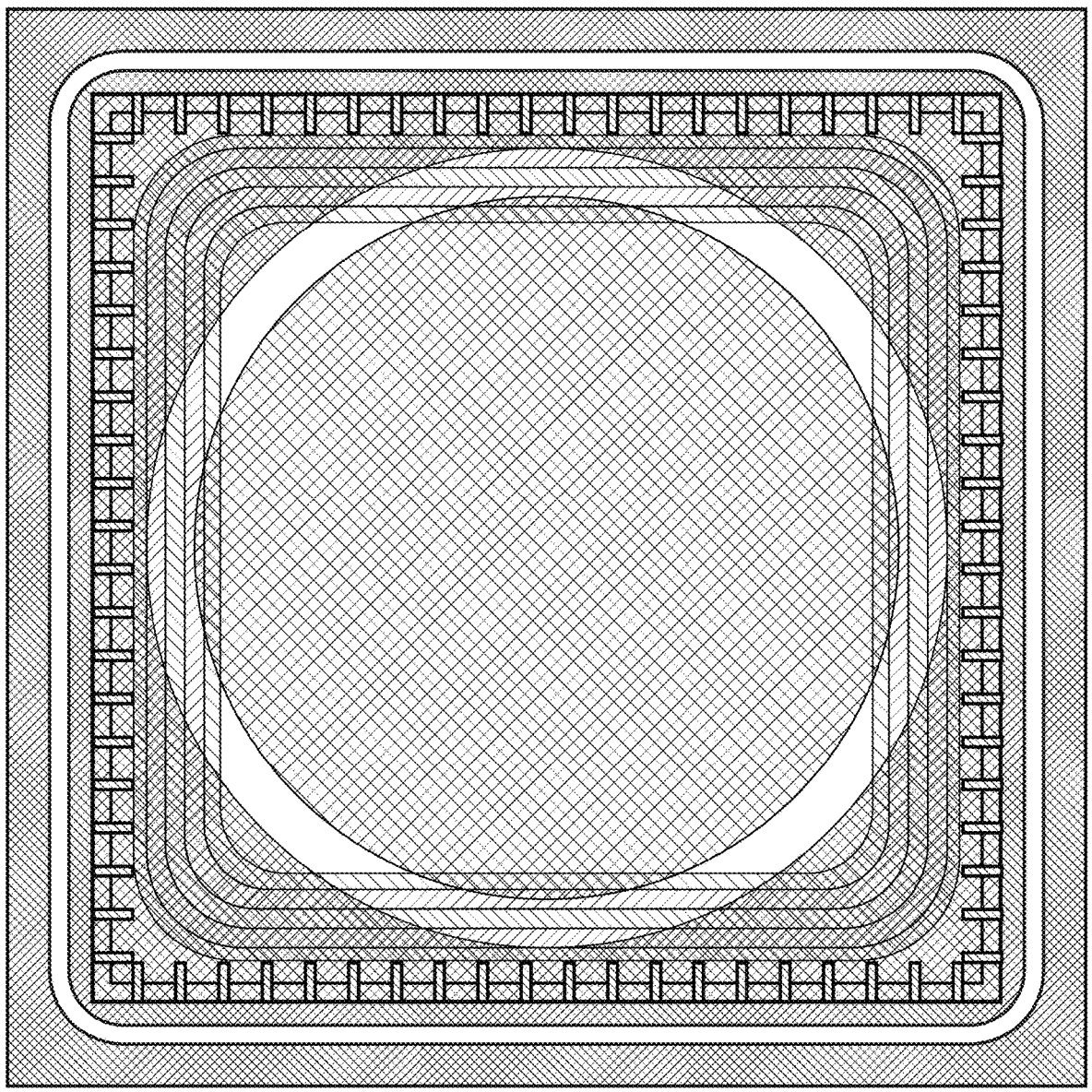
FIG. 33 shows a microscope recording of the thin-film layer before the step of providing the carrier structure.

FIG. 33 shows a microscope recording of the thin-film layer before the step of providing the carrier structure. In detail, FIG. 33 shows the thin-film layer in finished processed form on the carrier substrate. The holes of the filter structure of 7 µm cannot be discerned on account of the low microscope magnification chosen. The anti-sticking structure (vertical and diagonal lines) lying below the thin-film layer can be discerned in the central region of the filter structure.

In exemplary embodiments, the anti-sticking structure 129 can comprise straight lines or linear elevations or concentric circles or circular elevations (e.g. having a line width of 1 µm). The anti-sticking structure 129 can be arranged below the thin-film layer 128 (e.g. particle barrier, membrane or filter).

In exemplary embodiments, the barrier layer of the particle barrier can be produced in various designs. The lattice causes noises if air passes through the lattice. Therefore, in exemplary embodiments, for the lattice structure a design having the highest hole-to-barrier ratio can be chosen, which is a hexagonal lattice, in order to reduce or even minimize the signal-to-noise ratio.

In exemplary embodiments, the inner area 160 of the thin-film layer 128 can comprise a lattice structure having hexagonal openings.

Figure 34:
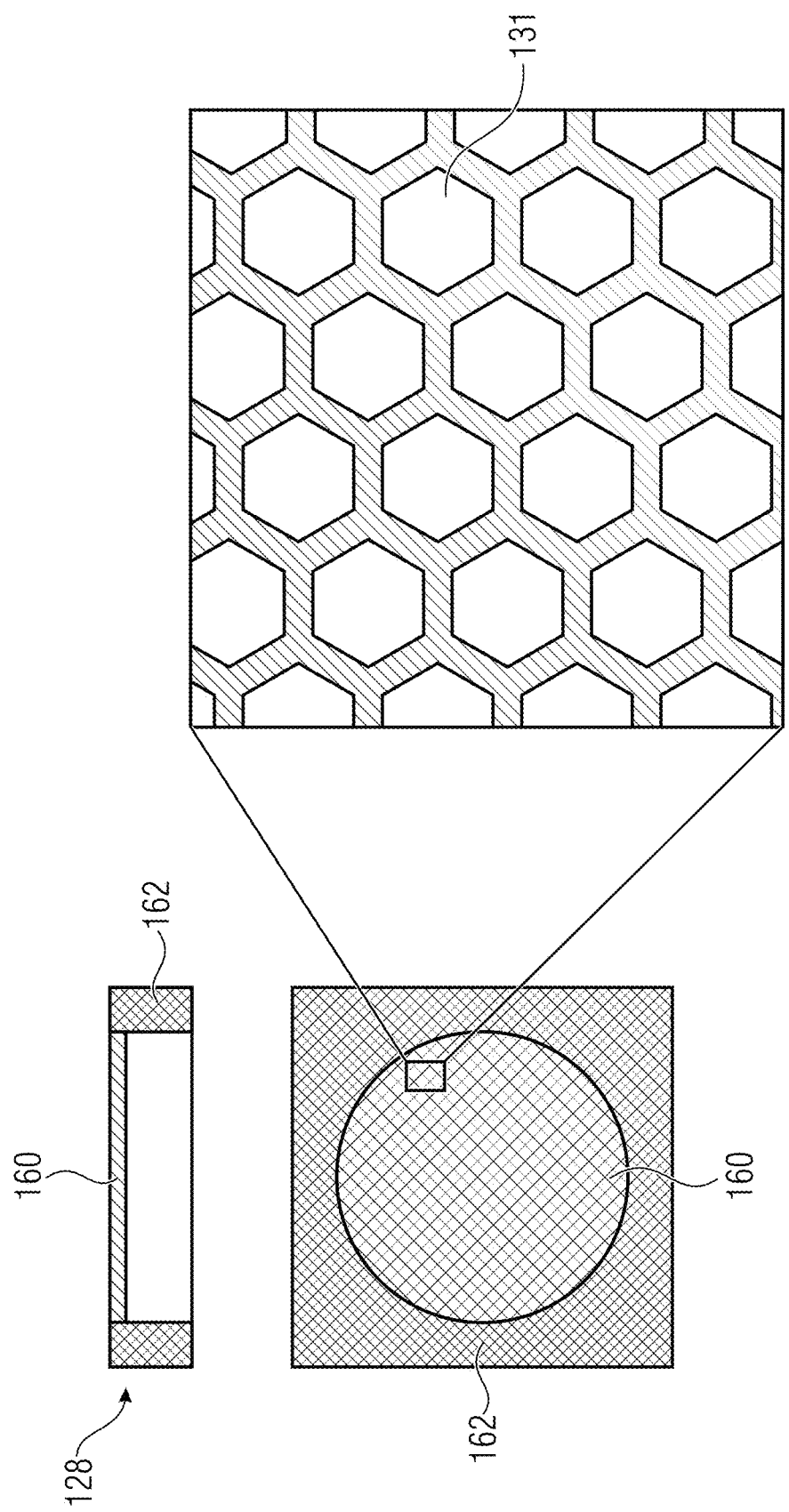
FIG. 34 shows a schematic sectional view of the thin-film layer and a schematic plan view of the thin-film layer, wherein the inner area of the thin-film layer has a lattice structure having hexagonal openings, wherein the inner area of the thin-film layer is carried by the outer area of the thin-film layer.

FIG. 34 shows a schematic sectional view of the thin-film layer 128 and a schematic plan view of the thin-film layer 128, wherein the inner area 160 of the thin-film layer 128 comprises a lattice structure having hexagonal openings 131, wherein the inner area 160 of the thin-film layer 128 is carried by the outer area 162 of the thin-film layer.

There are a number of possibilities for shipping the thin-film layer or a semiconductor device (e.g. a device or a microsystem) having the thin-film layer 128. By way of example, the semiconductor device can be shipped on a wafer or a film frame. For shipping the thin-film layer 128 or the semiconductor device having the thin-film layer 128 on a film frame, by way of example, a single-sided-adhesive transfer carrier layer (e.g. adhesive tape) 130 can be laminated on the wafer and the transfer carrier layer 130 can be detached from the wafer, wherein in this case the thin-film layer or the semiconductor device having the thin-film layer 128 sticks to the transfer carrier layer 130. Areas on the wafer on which e.g. no particle barrier is present are normally completely without a structure or completely filled. If this is the case, debonding the transfer carrier layer 130 from the wafer in these areas requires a high force since the transfer carrier layer 130 sticks to the wafer on the entire area. In exemplary embodiments, therefore, anti-sticking structures can be used in these areas in order to reduce the adhesion and hence the detachment force of the transfer carrier layer 130.

In exemplary embodiments, a further anti-sticking structure can be provided on an outer area 162 of the thin-film layer 128 or on a layer arranged thereon, such that during the process of detaching the inner area 160 of the thin-film layer 128 (or the semiconductor device having the inner area 160 of the thin-film layer 128) adhering to the transfer carrier layer from the outer area 162 of the thin-film layer 128, the transfer carrier layer 130 detaches more easily from the outer area 162 of the thin-film layer or from the layer arranged thereon.

In order to reduce the force required for detaching the transfer carrier layer 130 from the wafer, in exemplary embodiments, anti-sticking structures can be arranged in areas without a semiconductor device (e.g. mirror forms, notches, edge exclusion). The anti-sticking structures (e.g. SU-8) can have for example a size of 80×80 µm and be for example at a distance of 300 µm from one another.

In exemplary embodiments, the inner area 160 of the thin-film layer 128 or the semiconductor device (e.g. microsystem) having the inner area 160 of the thin-film layer 128 can also be detached from the outer area 162 of the thin-film layer 128 by means of a pick-and-place method.

Semiconductor devices are normally delivered to the customer on film frames (diced or cut), on so-called "tape and reel" packaging, as "waffle pack" or as wafers. The particle barrier (or membrane or filter) can be delivered to the customer on a film frame, wherein, in exemplary embodiments, the particle barrier or the device having the particle barrier can be transferred from the carrier wafer to the film frame by means of a pick-and-place method.

In order to avoid the process of transferring the particle barrier from the carrier wafer to the film frame, in exemplary embodiments, the particle barrier or the device having the particle barrier can also be picked up directly from the carrier wafer by means of a pick-and-place method. During the process of picking up the particle barrier or the device having the particle barrier, the holding structures that hold the particle barrier in its place tear or break.

A further method for producing the thin-film layer is described below.

Figure 35:
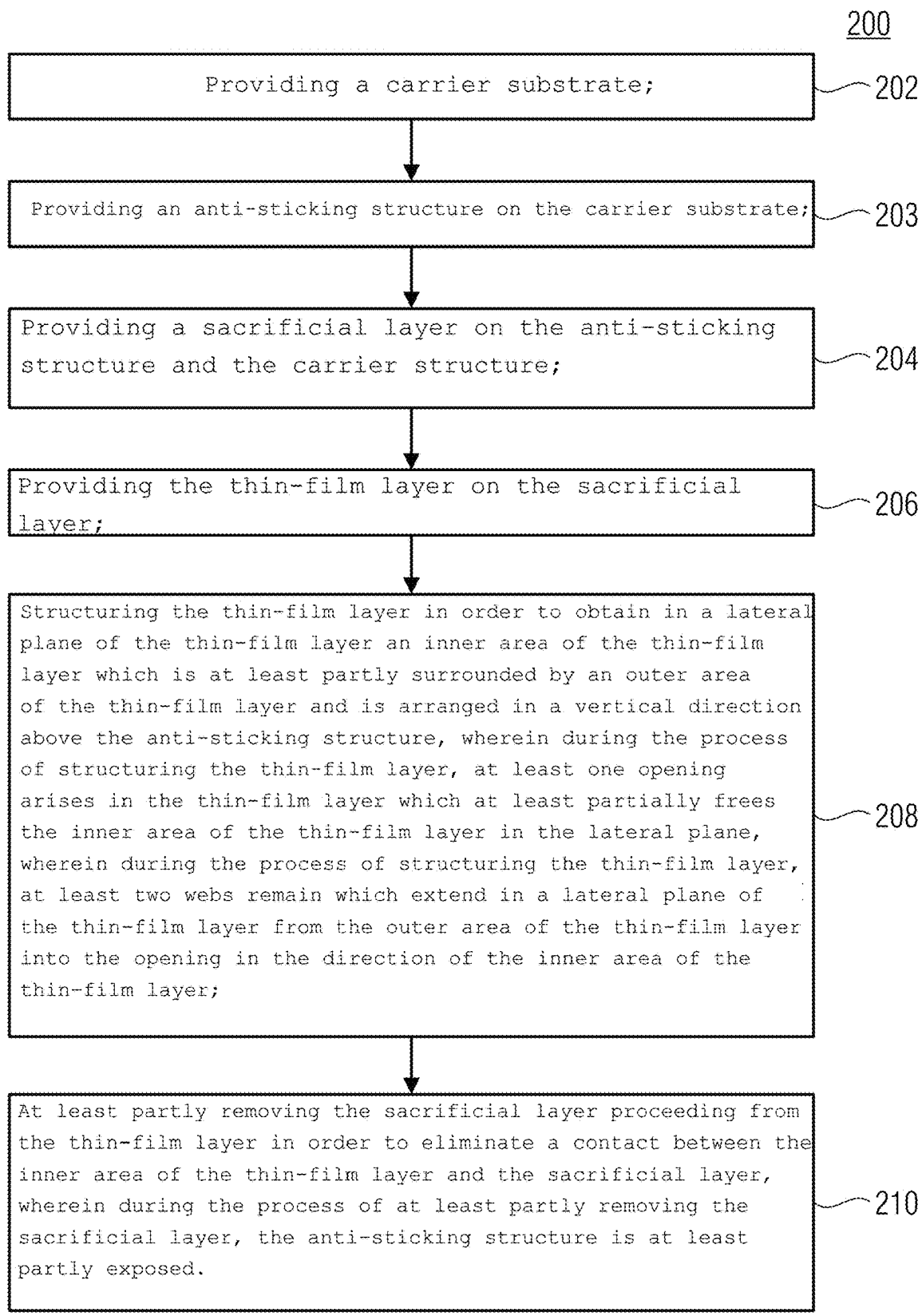
FIG. 35 shows a flow diagram of a method for producing a thin-film layer.

FIG. 35 shows a flow diagram of a method 200 for producing a thin-film layer. The method 200 comprises a step 202 of providing a carrier substrate. Furthermore, the method 20, comprises a step 203 of providing an anti-sticking structure on the carrier substrate. Furthermore, the method comprises a step 204 of providing a sacrificial layer on the anti-sticking structure and the carrier substrate. Furthermore, the method 200 comprises a step 206 of providing the thin-film layer on the sacrificial layer. Furthermore, the method comprises a step of structuring 208 the thin-film layer in order to obtain in a lateral plane of the thin-film layer an inner area of the thin-film layer which is at least partly surrounded by an outer area of the thin-film layer and is arranged in a vertical direction above the anti-sticking structure, wherein during the process of structuring the thin-film layer, at least one opening arises in the thin-film layer which at least partially frees the inner area of the thin-film layer in the lateral plane, wherein during the process of structuring the thin-film layer, at least two webs remain which extend in a lateral plane of the thin-film layer from the outer area of the thin-film layer into the opening in the direction of the inner area of the thin-film layer. Furthermore, the method 200 comprises a step 210 of at least partly removing the sacrificial layer proceeding from the thin-film layer in order to eliminate a contact between the inner area of the thin-film layer and the sacrificial layer, wherein during the process of at least partly removing the sacrificial layer, the anti-sticking structure is at least partly exposed.

Exemplary embodiments of the method 200 are described in detail below with reference to FIGS. 36 to 45, which show schematic sectional views of intermediate products of the production of a thin-film layer after the various method steps.

FIG. 36 shows a schematic sectional view of an intermediate product 118 of the method for producing a thin-film layer after steps 202, 203 and 204 of providing the carrier substrate 120, providing the anti-sticking structure 129 on the carrier substrate 120 and providing the sacrificial layer 124 on the anti-sticking structure 129 and the carrier substrate 120.

The carrier substrate 120 can be for example a semiconductor substrate or semiconductor wafer, such as e.g. a silicon substrate or silicon wafer.

The anti-sticking structure 129 can comprise elevations (e.g. dams or dykes) extending in at least one lateral dimension along a surface of the carrier substrate 120.

The elevations can have a width (e.g. in a lateral plane) of less than 2 μm, e.g. a width of 1 μm. Furthermore, the elevations can have a length (e.g. in a lateral plane) of more than 100 μm (or 200 μm, or 300 μm, or 400 μm, or 500 μm, or 600 μm, or 700 μm, or 800 μm), such as e.g. a length of approximately 850 μm.

As is indicated in FIG. 36, the elevations can extend in one lateral dimension along a surface of the carrier substrate 120, wherein the elevations form a line in a lateral plane (of the elevations). Alternatively, the elevations can extend in two lateral dimensions along the surface of the carrier substrate 120, wherein the elevations form circles in a lateral plane (of the elevations). In this case, a diameter of the circles can be greater than a diameter of the openings of a lattice structure of the thin-film layer 128 (e.g. particle barrier, membrane or filter).

By way of example, the anti-sticking structure 129 can comprise anti-sticking lines. The anti-sticking structure thus does not comprise punctiform pyramids, but rather long thin lines (e.g. having a width of 1 μm, for example, and/or a length of 850 μm, for example). In this case, the anti-sticking structure can comprise straight lines or concentric circles (e.g. having a line width of 1 μm) below the particle barrier.

The sacrificial layer 124 can be a silicon oxide layer, for example.

FIG. 37 shows a schematic sectional view of an intermediate product 118 of the method for producing a thin-film layer after step 206 of providing the thin-film layer 128 on the sacrificial layer 124 and after step 208 of structuring the thin-film layer 128.

As is indicated in FIG. 37, structuring the thin-film layer 128 results, in a lateral plane of the thin-film layer 128, in an inner area 160 of the thin-film layer 128 which is at least partly surrounded by an outer area 162 of the thin-film layer 128, wherein during the process of structuring the thin-film layer, at least one opening arises in the thin-film layer which at least partially frees the inner area 160 of the thin-film layer in the lateral plane, wherein during the process of structuring the thin-film layer, at least two webs 164 remain which extend in a lateral plane of the thin-film layer 128 from the outer area 162 of the thin-film layer 128 into the opening in the direction of the inner area 160 of the thin-film layer 128.

The inner area 160 of the thin-film layer 128 can be arranged adjacent to the anti-sticking structure 129. In other words, the inner area 160 of the thin-film layer can be arranged in a vertical dimension above the anti-sticking structure 129.

The thin-film layer 128 can be deposited onto the sacrificial layer 124, for example. The thin-film layer 128 can have a thickness of less than 100 μm (or 70 μm, or 50 μm, or 30 μm, or 20 μm, or 10 μm, or 5 μm).

The thin-film layer 128 can be structured for example by means of a photolithographic method and subsequent etching.

By way of example, the thin-film layer 128 can be a membrane or a filter, for example of a microsystem (MEMS=microelectromechanical system). The microsystem can be produced on the thin-film layer 128, for example, such that the thin-film layer 128 is part of the microsystem.

By way of example, the thin-film layer can be a polyimide layer or a combination of polyimide layer and SU-8 layer.

By way of example, the inner area 160 of the thin-film layer 128 can comprise a lattice structure having hexagonal openings, wherein the lattice structure forms a particle barrier, a filter or a membrane.

By way of example, a hexagonal lattice can be used as particle barrier. The hole diameter can be between 5 μm and 100 μm. The bridge width can be between 1 μm and 20 μm.

FIG. 38 shows a schematic sectional view of an intermediate product 118 of the method for producing a thin-film layer after step 210 of at least partly removing the sacrificial layer 124 proceeding from the thin-film layer 128 (=in the substrate depth direction) in order to eliminate a contact between the inner area 160 of the thin-film layer 128 and the sacrificial layer 124.

As can be discerned in FIG. 38, after at least partly removing the sacrificial layer below the inner area 160 of the thin-film layer 128, the inner area 160 of the thin-film layer 128 is carried only by the at least two webs 164 of the outer area 162 of the thin-film layer 128.

By way of example, the sacrificial layer 124 can be at least partly removed proceeding from the thin-film layer 128 by means of an HF etch (HF=hydrofluoric acid).

The step 212 of detaching the inner area 160 of the thin-film layer 128 from the outer area 162 of the thin-film layer 128 is explained in greater detail below with reference to FIGS. 39 and 40.

Figure 39:
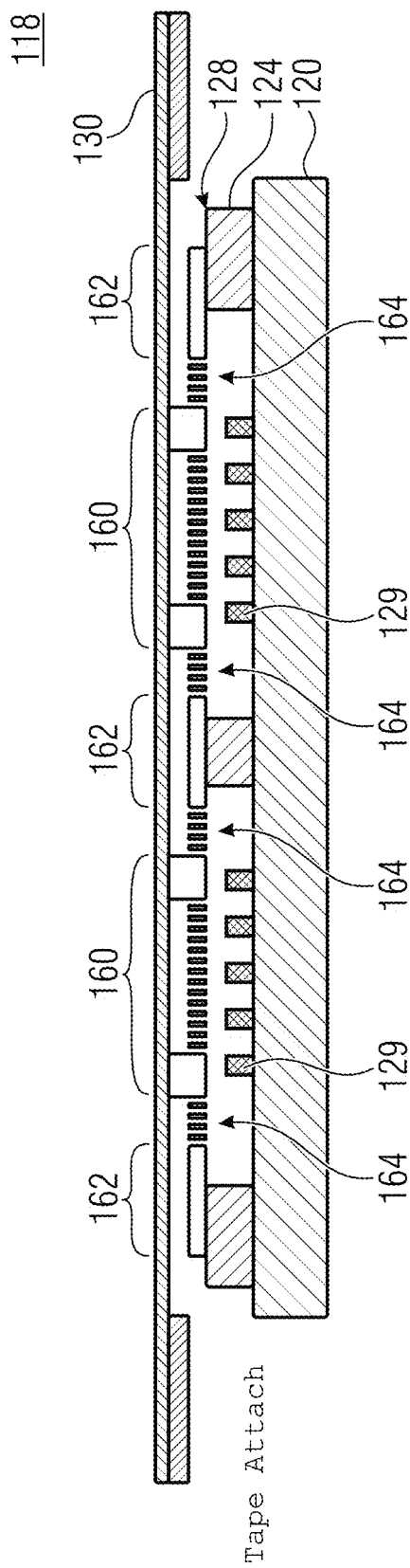
FIG. 39 shows a schematic sectional view of an intermediate product of the method for producing a thin-film layer after the step of providing an at least single-sided-adhesive transfer carrier layer on the thin-film layer, such that the inner area of the thin-film layer adheres to the transfer carrier layer.

FIG. 39 shows a schematic sectional view of an intermediate product 118 of the method for producing a thin-film layer after the step of providing an at least single-sided-adhesive transfer carrier layer 130 on the thin-film layer 128, such that the inner area 160 of the thin-film layer 128 adheres to the transfer carrier layer 130. By way of example, the transfer carrier layer 130 can comprise adhesive or an adhesive layer at a side facing the thin-film layer 128. By way of example, the transfer carrier layer 130 can be an adhesive tape.

Figure 40:
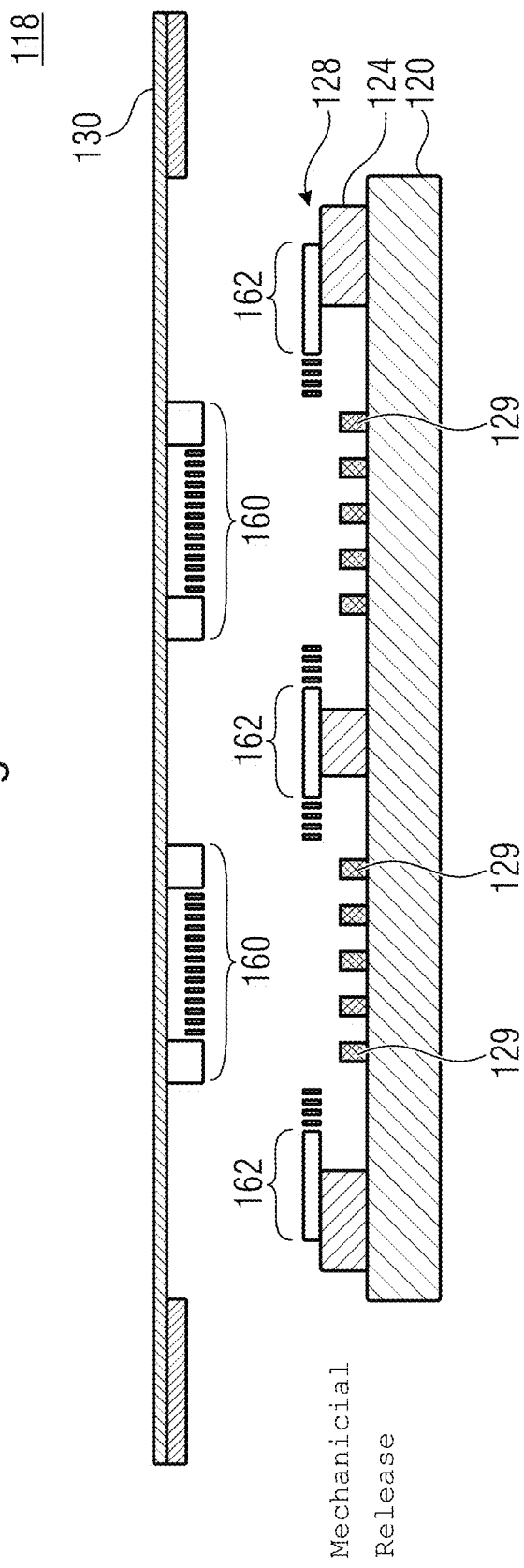
FIG. 40 shows a schematic sectional view of an intermediate product of the method for producing a thin-film layer after the step of detaching the transfer carrier layer in order to detach the inner area of the thin-film layer adhering to the transfer carrier layer from the outer area of the thin-film layer.

FIG. 40 shows a schematic sectional view of an intermediate product 118 of the method for producing a thin-film layer after the step of detaching the transfer carrier layer 130 in order to detach the inner area 160 of the thin-film layer 128 adhering to the transfer carrier layer 130 from the outer area 162 of the thin-film layer 128.

During the process of detaching the inner area 160 of the thin-film layer 128 from the outer area 162 of the thin-film layer 128, the at least two webs 164 of the outer area 162 of the thin-film layer 128 can break.

Optionally, before providing the transfer carrier layer 130, a further anti-sticking structure can be provided on the outer area 162 of the thin-film layer 128 or on a layer arranged thereon. By means of the further anti-sticking structure, during the process of detaching the inner area 160 of the thin-film layer 128 (or the semiconductor device having the inner area 160 of the thin-film layer 128) adhering to the transfer carrier layer from the outer area 162 of the thin-film layer 128, the transfer carrier layer 130 can detach more easily from the outer area 162 of the thin-film layer or from the layer arranged thereon.

The further anti-sticking structure can comprise anti-sticking pins, for example. The anti-sticking pins can have various shapes, such as e.g. a circular shape having a radius of 10 μm to 100 μm, or a rectangular shape having the dimensions 10×10 μm to 500×500 μm. The distance between the anti-sticking pins can be between 20 μm and 2000 μm.

A further exemplary embodiment of the method 200 shown in FIG. 35 is described below.

FIG. 41 shows a schematic sectional view of an intermediate product 118 of the method for producing a thin-film layer after steps 202, 203 and 204 of providing the carrier substrate 120, providing the anti-sticking structure 129 on the carrier substrate 120 and providing the sacrificial layer 124 on the anti-sticking structure 129 and the carrier substrate 120.

The carrier substrate 120 can be for example a semiconductor substrate or semiconductor wafer, such as e.g. a silicon substrate or silicon wafer.

The anti-sticking structure 129 can comprise elevations (e.g. dams or dykes) extending in at least one lateral dimension along a surface of the carrier substrate 120.

The elevations can have a width (e.g. in a lateral plane) of less than 2 μm, e.g. a width of 1 μm. Furthermore, the elevations can have a length (e.g. in a lateral plane) of more than 100 μm (or 200 μm, or 300 μm, or 400 μm, or 500 μm, or 600 μm, or 700 μm, or 800 μm), such as e.g. a length of approximately 850 μm.

As is indicated in FIG. 41, the elevations can extend in one lateral dimension along a surface of the carrier substrate 120, wherein the elevations form a line in a lateral plane (of the elevations). Alternatively, the elevations can extend in two lateral dimensions along the surface of the carrier substrate 120, wherein the elevations form circles in a lateral plane (of the elevations). In this case, a diameter of the circles can be greater than a diameter of the openings of a lattice structure of the thin-film layer 128 (e.g. particle barrier, membrane or filter).

By way of example, the anti-sticking structure 129 can comprise anti-sticking lines. The anti-sticking structure thus does not comprise punctiform pyramids, but rather long thin lines (e.g. having a width of 1 μm, for example, and/or a length of 850 μm, for example). In this case, the anti-sticking structure can comprise straight lines or concentric circles (e.g. having a line width of 1 μm) below the particle barrier.

The sacrificial layer 124 can be a silicon oxide layer, for example.

FIG. 42 shows a schematic sectional view of an intermediate product 118 of the method for producing a thin-film layer after step 206 of providing the thin-film layer 128 on the sacrificial layer 124 and after step 208 of structuring the thin-film layer 128.

As is indicated in FIG. 42, structuring the thin-film layer 128 results, in a lateral plane of the thin-film layer 128, in an inner area 160 of the thin-film layer 128 which is at least partly surrounded by an outer area 162 of the thin-film layer 128, wherein during the process of structuring the thin-film layer, at least one opening arises in the thin-film layer which at least partially frees the inner area 160 of the thin-film layer in the lateral plane, wherein during the process of structuring the thin-film layer, at least two webs 164 remain which extend in a lateral plane of the thin-film layer 128 from the outer area 162 of the thin-film layer 128 into the opening in the direction of the inner area 160 of the thin-film layer 128.

The inner area 160 of the thin-film layer 128 can be arranged adjacent to the anti-sticking structure 129. In other words, the inner area 160 of the thin-film layer can be arranged in a vertical dimension above the anti-sticking structure 129.

The thin-film layer 128 can be deposited onto the sacrificial layer 124, for example. The thin-film layer 128 can have a thickness of less than 100 μm (or 70 μm, or 50 μm, or 30 μm, or 20 μm, or 10 μm, or 5 μm).

The thin-film layer 128 can be structured for example by means of a photolithographic method and subsequent etching.

By way of example, the thin-film layer 128 can be a membrane or a filter, for example of a microsystem (MEMS=microelectromechanical system). The microsystem can be produced on the thin-film layer 128, for example, such that the thin-film layer 128 is part of the microsystem.

By way of example, the thin-film layer can be a polyimide layer or a combination of polyimide layer and SU-8 layer.

By way of example, the inner area 160 of the thin-film layer 128 can comprise a lattice structure having hexagonal openings, wherein the lattice structure forms a particle barrier, a filter or a membrane.

By way of example, a hexagonal lattice can be used as particle barrier. The hole diameter can be between 5 μm and 100 μm. The bridge width can be between 1 μm and 20 μm.

FIG. 43 shows a schematic sectional view of an intermediate product 118 of the method for producing a thin-film layer after step 210 of at least partly removing the sacrificial layer 124 proceeding from the thin-film layer 128 (=in the substrate depth direction) in order to eliminate a contact between the inner area 160 of the thin-film layer 128 and the sacrificial layer 124.

As can be discerned in FIG. 43, after at least partly removing the sacrificial layer below the inner area 160 of the thin-film layer 128, the inner area 160 of the thin-film layer 128 is carried only by the at least two webs 164 of the outer area 162 of the thin-film layer 128.

By way of example, the sacrificial layer 124 can be at least partly removed proceeding from the thin-film layer 128 by means of an HF etch (HF=hydrofluoric acid).

The step 212 of detaching the inner area 160 of the thin-film layer 128 from the outer area 162 of the thin-film layer 128 is explained in greater detail below with reference to FIGS. 44 and 45.

FIG. 44 shows a schematic sectional view of an intermediate product 118 of the method for producing a thin-film layer after a step of providing a wafer 134 and mounting the carrier substrate 120 on the wafer 134 before detaching the inner area 160 of the thin-film layer 128 from the outer area 162 of the thin-film layer.

FIG. 45 shows a schematic sectional view of an intermediate product 118 of the method for producing a thin-film layer after a step of detaching the inner area 160 of the thin-film layer 128 from the outer area 162 of the thin-film layer 128 by means of a pick-and-place method.

The pick-and-place can be implemented as pick-and-place or flip-chip.

Figure 46:
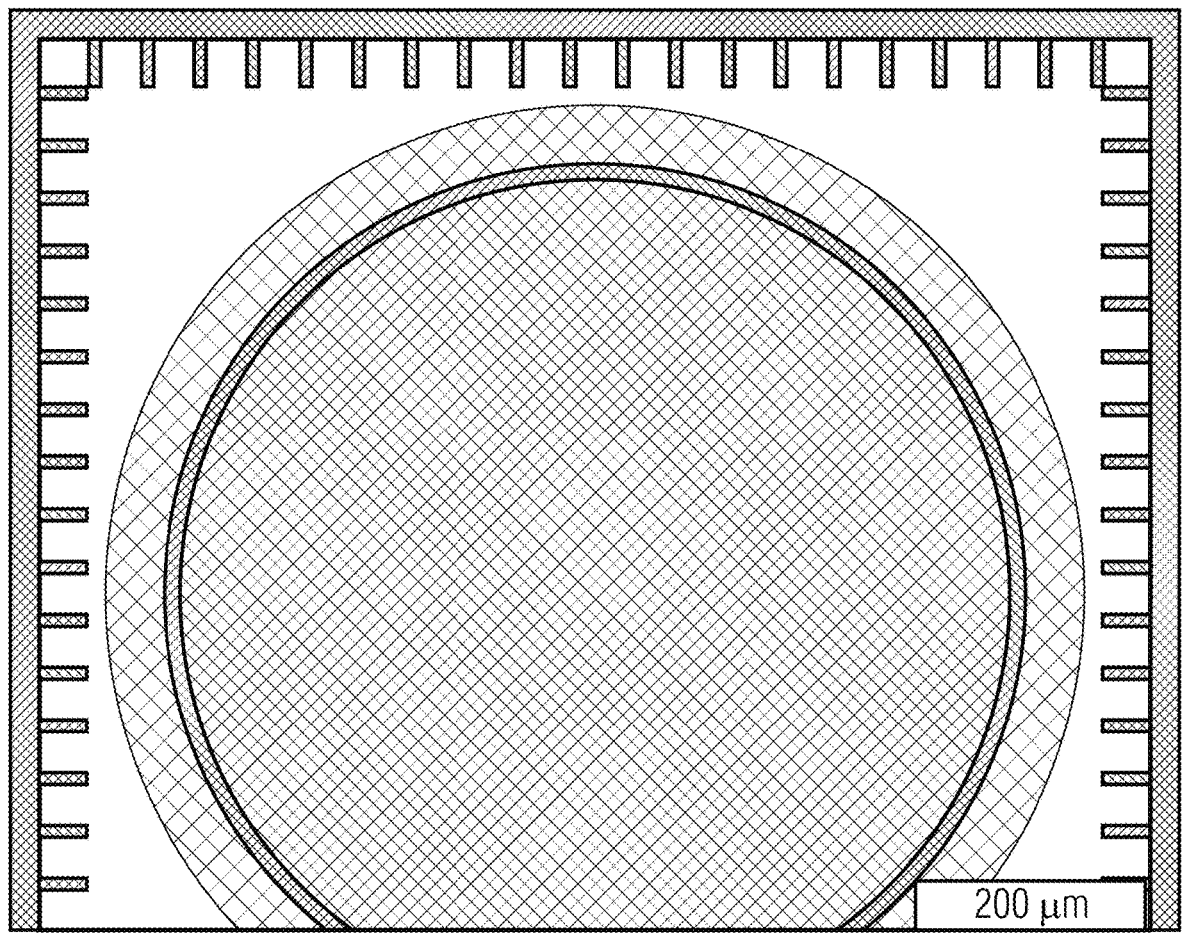
FIG. 46 shows a schematic plan view of the thin-film layer after the step of structuring the thin-film layer and the step of providing the carrier structure.

FIG. 46 shows a schematic plan view of the thin-film layer after the step of structuring the thin-film layer and the step of providing the carrier structure. In detail, FIG. 46, like FIG. 31, shows a filter structure, with the difference that the filter structure runs out in the SU-8 frame as lattice. In FIG. 31, the filter structure is closed in the SU-8 frame.

As can be discerned in FIG. 46, by virtue of the anti-sticking lines on the carrier substrate, the particle barrier (or membrane or filter) can be detached from the carrier substrate without the particle barrier being damaged.

In exemplary embodiments, the carrier substrate can comprise anti-sticking lines. The anti-sticking lines can be used as anti-sticking structures.

In exemplary embodiments, a hexagonal lattice can be used as particle barrier. The barrier layer of the particle barrier can have a hexagonal design.

In exemplary embodiments, anti-sticking pins can be used in areas without semiconductor devices. The adhesion of the transfer carrier layer (e.g. adhesive tape) on the carrier substrate during the transfer process can be reduced by the positioning of anti-sticking pins in areas without semiconductor devices.

In exemplary embodiments, a pick-and-place method can be used. Semiconductor devices can be debonded from the carrier substrate by means of a pick-and-place method.

Although specific embodiments have been illustrated and described here, it is obvious to the person of average skill in the art that a multiplicity of alternative and/or equivalent implementations can replace the specific embodiments shown and described, without departing from the scope of the present invention. This application is intended to cover all adaptations or variations of the specific embodiments discussed herein. Therefore, the intention is for this invention to be restricted only by the claims and the equivalents thereof.

What is claimed is:

1. A method for producing a thin-film layer, wherein the method comprises:
   providing a carrier substrate;
   providing a layer stack on the carrier substrate, wherein the layer stack comprises a carrier layer and a sacrificial layer, wherein the sacrificial layer comprises areas in which the carrier layer is exposed;
   providing the thin-film layer on the layer stack, such that the thin-film layer bears on the sacrificial layer and, in the areas of the sacrificial layer in which the carrier layer is exposed, against the carrier layer;
   at least partly removing the sacrificial layer proceeding from the thin-film layer in order to eliminate a contact between the thin-film layer and the sacrificial layer at least in areas; and
   detaching the thin-film layer from the carrier layer.

2. The method as claimed in claim 1,
   wherein the thin-film layer has a thickness of less than 100 µm.

3. The method as claimed in claim 1,
   wherein the thin-film layer is a filter or a membrane.

4. The method as claimed claim 1,
   wherein the thin-film layer is a polyimide layer or a combination of polyimide layer and SU 8 layer.

5. The method as claimed in claim 1,
   wherein providing the layer stack comprises:
   providing the carrier layer on the carrier substrate;
   providing the sacrificial layer on the carrier layer; and
   opening the sacrificial layer in areas as far as the carrier layer in order to obtain the areas in which the carrier layer is exposed.

6. The method as claimed in claim 5,
   wherein the areas in which the carrier layer is exposed are holes.

7. The method as claimed in claim 6,
   wherein the holes have a diameter of 10 µm.

8. The method as claimed in claim 1,
   wherein the sacrificial layer is a second sacrificial layer, and wherein providing the layer stack comprises the following steps:
   providing a first sacrificial layer on the carrier substrate, wherein the first sacrificial layer comprises elevations;
   providing the carrier layer on the first sacrificial layer;
   providing the second sacrificial layer on the carrier layer;
   at least partly removing the second sacrificial layer as far as the carrier layer on the elevations of the first sacrificial layer in order to obtain the areas in which the carrier layer is exposed.

9. The method as claimed in claim 8,
   wherein the elevations have a diameter of 20 µm or less.

10. The method as claimed in claim 8,
    wherein the areas of the carrier layer which are exposed in the areas of the sacrificial layer have a surface area of less than 40% of a total surface area of the carrier layer.

11. The method as claimed in claim 8,
    wherein the sacrificial layer comprises silicon oxide, aluminum, titanium or copper.

12. The method as claimed in claim 8,
    wherein the carrier layer comprises nitride or silicon nitride.

13. The method as claimed in claim 1,
    wherein detaching the thin-film layer comprises the following steps:
    providing an at least single-sided-adhesive transfer carrier layer on the thin-film layer such that the thin-film layer adheres to the transfer carrier layer;
    detaching the transfer carrier layer in order to detach the thin-film layer adhering to the transfer carrier layer from the carrier layer.

14. The method as claimed in claim 13,
    wherein the transfer carrier layer comprises an adhesive layer on a side facing the thin-film layer.

15. The method as claimed in claim 13,
    wherein the method further comprises:
    structuring the thin-film layer before detaching the thin-film layer.

16. The method as claimed in claim 13,
    wherein the method further comprises:
    producing at least one microsystem on the thin-film layer;
    wherein during the process of detaching the thin-film layer, the at least one microsystem is detached together with the thin-film layer.

17. The method as claimed in claim 16,
    wherein the thin-film layer is part of the at least one microsystem.

* * * * *